(12) United States Patent
Liu et al.

(10) Patent No.: US 12,740,216 B2
(45) Date of Patent: Sep. 15, 2026

(54) LED DEVICE HAVING POROUS REGION OF III-NITRIDE MATERIAL

(71) Applicant: PORO TECHNOLOGIES LTD, Cambridge (GB)

(72) Inventors: Yingjun Liu, Cambridge (GB); Tongtong Zhu, Cambridge (GB); Muhammad Ali, Cambridge (GB)

(73) Assignee: PORO TECHNOLOGIES LTD, Cambridge (GB)

( * ) Notice: Subject to any disclaimer, the term of this patent is extended or adjusted under 35 U.S.C. 154(b) by 454 days.

(21) Appl. No.: 18/040,534

(22) PCT Filed: Aug. 4, 2021

(86) PCT No.: PCT/GB2021/052023

§ 371 (c)(1),
(2) Date: Feb. 3, 2023

(87) PCT Pub. No.: WO2022/029437

PCT Pub. Date: Feb. 10, 2022

(65) Prior Publication Data

US 2024/0014348 A1 Jan. 11, 2024

(30) Foreign Application Priority Data

Aug. 4, 2020 (GB) ..................................... 2012098
Aug. 4, 2020 (GB) ..................................... 2012103
(Continued)

(51) Int. Cl.
*H10H 29/14* (2025.01)
*H10H 20/01* (2025.01)
(Continued)

(52) U.S. Cl.
CPC ...... *H10H 29/142* (2025.01); *H10H 20/0137* (2025.01); *H10H 20/812* (2025.01);
(Continued)

(58) Field of Classification Search
CPC .... H10H 29/142; H10H 20/812; H10H 29/14; H10H 20/0137; H10H 20/825; H10H 20/01335; H10H 20/817; H01L 25/0753
(Continued)

(56) References Cited

U.S. PATENT DOCUMENTS 10,361,341 B2 7/2019 Danesh et al.
10,651,357 B2 5/2020 Andrews
(Continued)

FOREIGN PATENT DOCUMENTS

CN 106165125 A 11/2016
CN 107946417 A 4/2018
(Continued)

OTHER PUBLICATIONS

International Search Report and Written Opinion of PCT/GB2021/052023, Nov. 2, 2021, 15 pages.
(Continued)

*Primary Examiner* — Eliseo Ramos Feliciano
*Assistant Examiner* — Mikka Liu
(74) *Attorney, Agent, or Firm* — Merchant & Gould P.C.

(57) ABSTRACT

A method of manufacturing an LED device comprises the steps of: forming a second LED structure over a first LED structure, in which at least one of the first or second LED structures is positioned over a porous region of III-nitride material. An LED device comprises a second LED structure positioned over a first LED structure, in which at least one of the first or second LED structures is positioned over a
(Continued)

porous region of III-nitride material. An array of LEDs and a three-colour LED device are also provided.

7 Claims, 18 Drawing Sheets

(30) Foreign Application Priority Data

| | | |
|---|---|---|
| Aug. 4, 2020 | (GB) | 2012105 |
| Aug. 4, 2020 | (GB) | 2012108 |
| Aug. 4, 2020 | (GB) | 2012110 |
| Nov. 16, 2020 | (GB) | 2018016 |
| Jan. 22, 2021 | (WO) | PCT/GB2021/050147 |
| Jan. 22, 2021 | (WO) | PCT/GB2021/050152 |
| Jan. 22, 2021 | (WO) | PCT/GB2021/050158 |
| Feb. 12, 2021 | (GB) | 2102012 |
| Feb. 12, 2021 | (GB) | 2102017 |
| Feb. 12, 2021 | (GB) | 2102021 |

(51) Int. Cl.
*H10H 20/812* (2025.01)
*H10H 20/817* (2025.01)
*H10H 20/825* (2025.01)
*H10W 90/00* (2026.01)

(52) U.S. Cl.
CPC ...... *H10H 20/817* (2025.01); *H10H 20/8252* (2025.01); *H10W 90/00* (2026.01)

(58) Field of Classification Search
USPC ........ 257/79, 88–89
See application file for complete search history.

(56) References Cited

U.S. PATENT DOCUMENTS

| | | | |
|---|---|---|---|
| 2005/0199883 | A1 | 9/2005 | Borghs et al. |
| 2009/0001416 | A1 | 1/2009 | Chua et al. |
| 2009/0140274 | A1 | 6/2009 | Wierer, Jr. et al. |
| 2010/0140629 | A1 | 6/2010 | Lee et al. |
| 2011/0193059 | A1 | 8/2011 | Wierer, Jr. et al. |
| 2013/0146842 | A1 | 6/2013 | Kim et al. |
| 2015/0125981 | A1 | 5/2015 | Ryu et al. |
| 2016/0197232 | A1 | 7/2016 | Bour et al. |
| 2017/0237234 | A1 | 8/2017 | Han et al. |
| 2018/0332677 | A1 | 11/2018 | Ku et al. |
| 2019/0123235 | A1 | 4/2019 | Cho et al. |
| 2019/0214529 | A1 | 7/2019 | Ahmed |
| 2020/0152841 | A1 | 5/2020 | Han et al. |
| 2020/0227255 | A1 | 7/2020 | Zhu et al. |
| 2022/0190026 | A1 | 6/2022 | Levy et al. |
| 2023/0051845 | A1* | 2/2023 | Zollner ........ H10H 29/14 |
| 2023/0085036 | A1* | 3/2023 | Mezouari ........ H10H 20/8312 257/40 |
| 2023/0215906 | A1 | 7/2023 | Cheng |

FOREIGN PATENT DOCUMENTS

| | | |
|---|---|---|
| CN | 109768135 | 5/2019 |
| JP | H11-145513 | 5/1999 |
| JP | 2004-079933 A | 3/2004 |
| JP | 2006-121037 A | 5/2006 |
| JP | 2007-27298 A | 2/2007 |
| JP | 2007-335879 A | 12/2007 |
| JP | 2009-21361 A | 1/2009 |
| JP | 2012-195529 | 10/2012 |
| JP | 2013-051437 A | 3/2013 |
| JP | 2014-127708 A | 7/2014 |
| JP | 2016-527706 A | 9/2016 |
| JP | 2018-502436 A | 1/2018 |
| JP | 2018-533847 A | 11/2018 |
| JP | 2019-516251 A | 6/2019 |
| KR | 10-1136063 B1 | 4/2012 |
| TW | 201921716 A | 6/2019 |
| WO | 2009/038324 A2 | 3/2009 |
| WO | 2013/140320 A1 | 9/2013 |
| WO | 2018/080860 A1 | 5/2018 |
| WO | 2019/027820 A1 | 2/2019 |
| WO | 2019/063957 | 4/2019 |
| WO | 2019/145728 | 8/2019 |

OTHER PUBLICATIONS

Exam Report for European Patent Application No. 21752137.6 (Jan. 21, 2025).

Inatomi et al., "Theoretical study of the composition pulling effect in InGaN metalorganic vapor-phase epitaxy growth," Japanese Journal of Applied Physics, vol. 56, No. 7 (2017).

International Search Report and Written Opinion for PCT/GB2021/050147 (Apr. 9, 2021).

International Search Report and Written Opinion for PCT/GB2021/050152 (Apr. 15, 2021).

International Search Report and Written Opinion for PCT/GB2021/050158 (Apr. 15, 2021).

International Search Report and Written Opinion for PCT/GB2021/052019 (Nov. 2, 2021).

International Search Report and Written Opinion for PCT/GB2021/052022 (Nov. 2, 2021).

Office Action for Japanese Patent Application No. 2022-544132 (Aug. 13, 2024).

Pasayat, Shubhra S. et al., "Growth of strain-GaN on micrometer-sized patterned compliant relaxedInGaN", Applied Physics Letters, Jan. 16, 2020, vol. 116, No. 11, p. 1-5.

Zhao, S. et al., "Molecular Beam Epitaxy of III-Nitride Nanowires: Emerging Applications from Deep-Ultraviolet Light Emitters and Micro-LEDs to Artificial Photosynthesis", 03 IEEE Nanotechnology Magazine, Mar. 4, 2019, vol. 13, No. 2 p. 6-16.

* cited by examiner

Substrate

1
Substrate 2
1
Substrate 3
2
1
Substrate 5
4
3
2
1
Substrate 6
5
4
3
2
1
Substrate
LED 1

Non-porous region
Porous region
6
5
4
3
2
1
Substrate
LED 1
Non-porous region
Porous region
6
5
4
3
2
1
Substrate
LED-1

LED DEVICE HAVING POROUS REGION OF III-NITRIDE MATERIAL

The present invention relates to semiconductor devices and a method of manufacture for semiconductor devices, in particular to LEDs devices, arrays of LED devices and an improved method of manufacturing LED devices.

BACKGROUND

Standard light-emitting diodes (LEDs) for light emission are normally larger than 200 μm×200 μm. Micro-LEDs are arrays of micro-scale LEDs with high density with lateral size down to less than 100 μm×100 μm. So a micro-LED may be defined as an LED structure with lateral dimensions (Length and width) smaller than 100 μm×100 μm all the way down to a few tens of nanometers or even smaller.

In the past, attempts have been made to manufacture micro-LEDs using known techniques. For example, prior attempts have used normal LED epitaxy and laser lift-off, electrostatic carry, and elastomer stamp for the transfer. However, there are problems with applying this approach to devices as small as micro-LEDs.

These problems include:

- Using normal LED epitaxy, it is challenging to generate all three main colours (RGB: red, green, blue) on the same chip of micro-LEDs.
- Efficiencies are low for green and red micro-LEDs.
- Dry etching is always needed to define micro-scale LED mesas. As LED sizes are smaller, plasma damage to the side wall of the LED structure will influence the emission efficiency and lifetime of the devices.
- Laser lift-off is low yield and costly.
- Transfer printing—low yield due to pre-existing strain/bow issues.

Due to these problems, conventional LED manufacture techniques are not satisfactory for the production of high quality micro-LEDs. In particular, conventional LED manufacture techniques are not satisfactory for the production of multi-colour LED devices comprising LEDs of multiple different colours on the same substrate.

SUMMARY OF INVENTION

The present application relates to an improved method of manufacturing LED devices, and to LED devices made using that method. The present invention is defined in the independent claims, to which reference should now be made. Preferred or advantageous features of the invention are set out in the dependent sub-claims.

The LED device is preferably formed from III-V semiconductor material, particularly preferably from III-nitride semiconductor material.

"III-V" semiconductors include binary, ternary and quaternary alloys of Group III elements, such as Ga, Al and In, with Group V elements, such as N, P, As and Sb), and are of great interest for a number of applications, including optoelectronics.

Of particular interest is the class of semiconductor materials known as "III-nitride" materials, which includes gallium nitride (GaN), indium nitride (InN) and aluminium nitride (AlN), along with their ternary and quaternary alloys. III-nitride materials have not only achieved commercial success in solid-state lighting and power electronics, but also exhibit particular advantages for quantum light sources and light-matter interaction.

While a variety of III-nitride materials are commercially interesting, Gallium nitride (GaN) is widely regarded as one of the most important new semiconductor materials, and is of particular interest for a number of applications.

It is known that the introduction of pores into bulk GaN can profoundly affect its material properties, for example its refractive index. The possibility of tuning the optical properties of GaN by altering its porosity therefore makes porous GaN of great interest for optoelectronic applications.

The present invention will be described by reference to GaN but may advantageously be applicable to alternative III-nitride materials.

Prior publications relating to the porosification of III-V semiconductor material include international patent applications PCT/GB2017/052895 (published as WO2019/063957) and PCT/GB2019/050213 (published as WO2019/145728).

The inventors have found that multi-coloured LED devices and arrays of multi-coloured LED devices can advantageously be provided using the present invention.

Method of Manufacturing an LED Device

According to a first aspect of the present invention there is provided a method of manufacturing an LED device, comprising the steps of:

- forming a second LED structure over a first LED structure, in which at least one of the first or second LED structures is positioned over a porous region of III-nitride material.

In a first embodiment, the method may comprise the steps of forming the first LED structure over the porous region, and forming the second LED structure over the first LED structure.

In another embodiment, preferably the present invention provides a method of manufacturing an LED device, comprising the steps of:

- forming a porous region of III-nitride material over a first LED structure; and forming a second LED structure over the porous region of III-nitride material.

The second LED structure, and/or the porous region, may preferably be formed over a first p-doped portion of the first LED structure.

The method of manufacturing an LED device may preferably comprise the steps of: forming a first electrically-insulating mask layer over a first p-doped portion of a first LED structure;

- removing a portion of the first mask layer to expose an exposed region of the first p-doped portion;
- forming a porous region of III-nitride material on the exposed region of the first p-doped portion; and
- forming a second LED structure over the porous region of III-nitride material.

The first LED structure is preferably configured to emit light at a first emission wavelength, and the second LED structure is configured to emit light at a second emission wavelength different from the first emission wavelength.

By providing a first LED structure configured to emit light at a first emission wavelength, and a second LED structure configured to emit light at a second emission wavelength, on top of the first LED structure, a multi-colour LED device is provided. Both first and second LED structures emit at different wavelengths, though they are provided as part of the same semiconductor structure.

The first LED structure and the second LED structure may be configured to emit light at a variety of wavelengths. For example, the first LED structure may be a green-emission LED structure, or a blue-emission LED structure, or a red-emission LED structure. The second LED structure may also be a green-emission LED structure, or a blue-emission LED structure, or a red-emission LED structure, but is configured to emit at a different colour than the first LED structure.

In preferred embodiments, the first LED structure is configured to emit light, when an electrical bias is applied across the LED structure, at a first emission wavelength of between 515 nm and 550 nm, preferably around 530 nm, and the second LED structure is configured to emit light at a second emission wavelength of between 570 nm and 630 nm, preferably a wavelength greater than 575 nm.

In other preferred embodiments, the first LED structure is configured to emit light, when an electrical bias is applied across the LED structure, at a first emission wavelength of between 400 nm and 500 nm, preferably between 430 nm and 470 nm, and the second LED structure is configured to emit light at a second emission wavelength of between 500 nm and 600 nm, preferably between 520 nm and 540 nm.

In certain preferred embodiments, the porous region may be a continuous region extending over the first LED structure, such that the porous region covers the first LED structure, and all LED structures subsequently grown above the first LED structure are formed over a porous region.

The LED device is preferably a laminar structure formed from a stack of flat layers of semiconductor material. The thicknesses, compositions and charge carrier concentrations in each layer of the structure may be controlled during epitaxial deposition of each layer or region of the structure. As the device is formed by sequential deposition of layers, subsequent layers are deposited over the top of earlier layers, so that they are positioned above the earlier layers in the resulting structure. Such devices are typically deposited as very thin layers on flat substrates, such that the lateral width of the layers are far greater than their height. By controlling the order in which layers are deposited, and controlling the lateral size and position of each layer relative to the layers below, the relative positions of the device components may be controlled. Except where indicated otherwise, a layer or region described herein as being formed or positioned "over" or "above" another layer is located both vertically above the other layer in the semiconductor structure, and extends laterally over an area which corresponds to an area of at least a portion of the other layer in the structure below.

In other preferred embodiments, a porous region of III-nitride material and a non-porous region of III-nitride material may be formed over, or above, the first p-doped portion. The porous region and the non-porous region may preferably be disposed in the same plane in the structure, for example a layer of the structure may be made up partially of porous III-nitride material, and partially of non-porous material. Thus the porous region may be positioned over only a portion of the first p-doped portion, while the non-porous region overlies another lateral area of the first p-doped portion. In this embodiment, the second LED structure may be positioned over, or above, the porous region, while another LED structure (for example a third LED structure, is positioned over the non-porous region.

The present inventors have realised that electrochemical porosification of III-nitride materials advantageously leads to a reduction in the strain in the III-nitride lattice, and a reduction in the overall wafer bow or curvature. Without wishing to be bound by theory, it is thought that the process of porosifying the porous region of III-nitride material also etches away structural defects, such as threading dislocations which were formed during growth of that layer on top of the layer of first III-nitride material.

The removal of dislocations from the semiconductor material of the porous region during porosification greatly reduces the strain in the porous region, which occurs particularly if the lattice dimension of the porous region does not match the lattice dimension of the underlying material. Thus, during epitaxial growth of the semiconductor structure when layers of III-nitride material are deposited above the porous region, the porous material is more compliant to matching the lattice of the overlying non-porous layers. This results in the layers above the porous region experiencing significantly lower strain than would be the case without the porous region.

Composition pulling effect: Kawaguchi et al. reported a so-called InGaN composition pulling effect in which the indium fraction is smaller during the initial stages of growth but increases with increasing growth thickness. This observation was to a first extent independent of the underlying layer, GaN or AlGaN. The authors suggested that this effect is caused by strain caused by the lattice mismatch at the interface. They found that a larger lattice mismatch between InGaN and the bottom epitaxial layers was accompanied by a larger change in the In content.

In *Theoretical study of the composition pulling effect in InGaN metalorganic vapor-phase epitaxy growth* by Inatomi et al (Japanese Journal of Applied Physics, Volume 56, Number 7) it was found that compressive strain suppresses the incorporation of InN. On the other hand, tensile strain promotes the incorporation of InN compared to the relaxed bulk growth case.

The inventors have found that the use of a porous region in the semiconductor structure leads to "strain relaxation" which reduces strain in the layers of a semiconductor structure, and that this can lead to an improvement with respect to the composition pulling effect. Porosification reduces the strain in the III-nitride layers and the semiconductor structure is made less strained, and thus the conditions for higher incorporation of In are made available. The present invention can therefore aid in higher Indium incorporation into layers of any LED structure grown over the porous region, which is highly desirable for emission at longer wavelengths.

By providing a porous region of III-nitride material in the LED, one or more of the LED structures may therefore be grown over the porous region with a lower strain than would be possible without the porous region. This reduced level of strain in the layered semiconductor structure can therefore aid in higher Indium incorporation into the light emitting layer(s) of the LED structure above the porous layer, so that high quality InGaN light emitting layers can be grown with a high Indium content. This allows enough indium to be incorporated into the light-emitting indium gallium nitride layer so that the LED emits light at a peak wavelength between 600 and 750 nm when an electrical bias is applied across the LED.

There is a huge demand for red LEDs that emit light between 600 and 750 nm, the technical difficulties of incorporating enough indium into the light emitting layer(s) has meant red InGaN LEDs have been hard to achieve. Shorter-wavelength LEDs such as green (500-550 nm) and yellow (550-600 nm) LEDs, however, are much easier to manufacture, as they can be made using InGaN light emitting regions containing a lower proportion of Indium than is needed for red light emission.

The inventors have found that growing an LED structure over a porous region of III-nitride material causes a significant shift in emission wavelength towards longer wavelengths, compared to an identical LED structure grown on a non-porous substrate.

As illustrated in the Figures, the inventors have demonstrated this by growing a conventional green/yellow (emission between 500-550 nm, or 550 nm-600 nm) InGaN LED structure on a non-porous GaN wafer, and demonstrating that the LED emits green/yellow light as expected. The same "green/yellow" InGaN LED structure was then grown on a template containing a porous region, and when an electrical bias was applied across the LED the LED emitted light in the red range of between 600 and 750 nm.

In a preferred embodiment, the present invention may comprise a second LED structure green/yellow (emission between 500-550 nm, or 550 nm-600 nm) InGaN LED structure formed on the connecting layer over the porous region, and a third LED structure green/yellow (emission between 500-550 nm, or 550 nm-600 nm) InGaN LED structure formed over a non-porous region above the first LED structure. The second LED structure and the third LED structure may have identical structures and compositions. Nevertheless, the position of the second LED structure over the porous region will shift the emission wavelength of the second LED structure so that it emits light at a different wavelength than the third LED structure. The third LED structure may emit light at green/yellow wavelengths (emission between 500-550 nm, or 550 nm-600 nm) as expected, while the second LED structure emits light at a longer wavelength of 600-650 nm. Multiple colours of emission may therefore be achieved simply by forming the same conventional LED structure twice—once over a non-porous region, and once over a porous region.

Particularly preferably, the second and third LED structures described above may be positioned above a first LED structure which is a blue LED structure configured to emit blue light when an electrical bias is applied across the first LED structure.

The first LED structure preferably comprises:

a first n-doped portion;

a first p-doped portion; and a first light emitting region located between the first n-doped portion and the first p-doped portion. The p-doped portion may be a p-doped layer. The method of the first aspect may preferably comprise a first step of forming the first LED structure.

Forming a first electrically-insulating (dielectric) mask layer, and then removing a portion of the mask to expose an exposed region of the p-doped connecting layer, creates a template or "footprint" on which the LED structures may be formed. The size and shape of the exposed regions may be controlled by controlling the size and shape of the portion of the mask that is removed. Subsequent layers of semiconductor material may then be deposited onto the exposed region to form the second LED structures respectively. By controlling the size and shape of the exposed region, the lateral size (length and width) and shape of the subsequently-formed LED structure may be controlled. This size control is particularly advantageous for growing micro-LED structures with extremely small lateral dimensions.

In the prior art, large-scale LED structures are grown and then divided into micro-LEDs by etching channels to cut the structure into micro-scale platforms or "mesas" of the desired lateral size. In micro-LEDs made with such prior art techniques, etching damage to the sidewalls of the LED structure can have a significant effect on the tiny pixels formed by micro-LEDs. This can harm the reliability and brightness of the micro-LEDs.

The method of the present invention may advantageously mean that the second LED structure is formed in a predefined exposed region, optionally with the correct size and shape to form a micro-LED. As the exposed region in the present invention controls the footprint of the respective LED structures, the second LED structures may advantageously be formed to an appropriate size in the first place, so there is no need to etch the LED structure of the present invention to reduce its lateral size. The resulting LED device may therefore avoid the dry etching damage that occurs in prior art methods.

Avoiding dry-etching damage to the active layers of the LED structures results in significant benefits compared to micro-LEDs prepared using prior art techniques, so that LED devices made using the present method are advantageously more reliable and brighter.

The steps of forming the first LED structure and the second LED structure may comprise growing LED structures according to conventional methods in the art. That is, the LED structures may be grown using known semiconductor deposition techniques and may have a variety of conventional LED epitaxial layers. While exemplary LED structures will be described herein by way of example, a large variety of LED structures (including various combinations of layer thicknesses, materials and doping levels) are known in the art and will be understood by the skilled person to be usable with the present invention.

The step of forming the second LED structure may comprise forming:

a second n-doped portion;

a second p-doped portion; and a second light emitting region located between the second n-doped portion and the second p-doped portion.

The step of forming the second LED structure may comprise forming the second LED structure on or over the porous region. There may be additional layers of III-nitride material positioned between the porous region and the second LED structure.

In certain preferred embodiments, a plurality of second LED structures may be formed on or over the porous region.

The step of forming a porous region of III-nitride material may comprise the steps of depositing a region of n-doped III-nitride material, and electrochemically porosifying a layer of III-nitride material, to form the porous region of III-nitride material. This may be achieved using a wafer scale porosification process as set out in international patent applications PCT/GB2017/052895 (published as WO2019/063957) and PCT/GB2019/050213 (published as WO2019/145728). This step should be carried out prior to forming an LED structure over the porous region, so that the overgrown LED structure is not also electrochemically porosified.

The method may preferably comprise the step of forming the porous region of III-nitride material by electrochemical porosification through a non-porous layer of III-nitride material, such that the non-porous layer of III-nitride material forms a non-porous intermediate layer. The non-porous intermediate layer may advantageously provide a smooth surface for overgrowth of the LED structure, following which the intermediate layer is positioned between the porous region and the n-doped portion of the overgrown LED structure.

The porous region may be formed by porosifying one or more layers or regions of III-nitride material. In order for the III-nitride material to be porosifiable, the material to be porosified should be n-type doped and have a doping concentration in the range of $1\times10^{17}$ to $1\times10^{20}$.

The porous region may be a porous layer, and the method may comprise the step of forming an LED structure over a porous layer of III-nitride material. Preferably the porous region may be a porous layer that is uniformly porous, for example formed from a continuous layer of porous III-nitride material.

The porous region may comprise a plurality of porous layers, and optionally a plurality of non-porous layers. In preferred embodiments of the invention, the porous region is a stack of alternating porous and non-porous layers, with the top surface of the stack defining the top of the porous region, and the bottom surface of the stack defining the bottom of the porous region. The n-doped connecting layer of III-nitride material may be formed over a porous region comprising a stack of porous layers of III-nitride material.

Alternatively the porous region may be a layer of III-nitride material that contains one or more porous regions, for example one or more porous regions in an otherwise non-porous layer of III-nitride material.

Preferably an intermediate layer of undoped III-nitride material is deposited over the doped material before it is porosified. The intermediate layer preferably have a thickness of between 1 nm and 3000 nm, preferably between 5 nm and 2000 nm, or between 1000 nm and 1500 nm.

As is known in the art, electrochemical porosification removes material from n-type doped regions of III-nitride materials, and creates empty pores in the semiconductor material.

In preferred embodiments, prior to porosification the doped region consists of an alternating stack of layers that are in a sequence of highly-doped layer/low-doped layer. The stack may consist of high/low doping layer pairs, preferably wherein the stack contains between 2-50 pairs of layers. The thickness of each highly-doped layer may vary between 2 nm and 200 nm, or between 10 nm and 150 nm, or between 50 nm and 100 nm. Low-doped layers may have a thickness of between 2 nm and 180 nm, or between 10 nm and 150 nm, or between 50 nm and 100 nm.

The stack of porous layers may preferably be a stack of alternating porous and non-porous layers. Preferably the stack comprises between 2 and 50 pairs of porous and non-porous layers, stacked one on top of another. The porous layers may preferably have a thickness of between 2 nm and 200 nm, or between 10 nm and 150 nm, or between 50 nm and 100 nm. The non-porous layers may preferably have a thickness of between 2 nm and 180 nm, or between 10 nm and 150 nm, or between 50 nm and 100 nm.

In preferred embodiments, the n-doped connecting layer of III-nitride material is formed over a stack of multiple porous layers of III-nitride material. Thus, rather than being a single porous layer of III-nitride material, the porous region may be a stack of layers of III-nitride material in which at least some layers are porous.

The porous region, or each porous layer in the porous region, may have a porosity of between 1% and 99% porous. Preferably the porous region, or each porous layer in the stack, has a porosity of between 10% and 90% porosity, or between 10% and 70% porosity.

In a preferred embodiment, the second LED structure is grown over the porous region, preferably by deposition of the second LED structure onto a non-porous intermediate layer.

The first LED structure may be formed on or over a substrate. The substrate may be Silicon, Sapphire, SiC, β-Ga2O3. The crystal orientation of the substrates can be polar, semi-polar or non-polar orientation. The substrate thickness may typically vary between 100 μm and 1500 μm.

The first LED structure is preferably formed over one or more template layers of III-nitride material on a substrate. The template layer(s) of III-nitride material may be non-porous, or in certain embodiments the template layer may be a porous layer of III-nitride material.

In preferred embodiments, the template layer may have a lateral dimension (width or length) equivalent to that of the substrate on which the template layer or region is grown. For example, conventional substrate wafer sizes may have a variety of sizes, such as 1 $cm^2$, or 2 inch, 4 inch, 6 inch, 8 inch, 12 inch, or 16 inch diameter.

The template layer may comprise a layer, or a stack of layers, of undoped or n-doped III-nitride semiconductor material grown on the substrate. The template layer may contain one or a combination of these elements: Al, Ga, In (ternary of quaternary layer). The thickness of the template layer(s) is preferably between 10-4000 nm. The template layer may have a doping concentration between $1\times10^{17}$ $cm^{-3}$-$5\times10^{20}$ $cm^{-3}$.

In a preferred embodiment, a first mask layer may be deposited over the first p-doped portion before the porous region is formed. The first mask layer may be termed a first passivation layer. The first mask layer is preferably formed by depositing a layer of dielectric material over the p-doped portion, which may be a p-doped layer, of the first LED structure. Preferably the first mask layer is deposited over the entire surface of the first p-doped region, so that the first p-doped portion is completely covered in dielectric material. The mask layer can be formed from $SiO_2$, SiN, SiON, $AlO_x$ or any other suitable dielectric material.

The first mask layer may have a thickness of between 20 nm and 1000 nm, preferably between 100 nm and 800 nm, particularly preferably between 200 nm and 600 nm.

The first mask layer may be deposited by conventional deposition techniques such as plasma-enhanced chemical vapor deposition (PECVD), sputtering, atomic layer deposition (ALD), evaporation or in-situ metal organic chemical vapor deposition (MOCVD).

Standard lithographic techniques may be used to remove portions of the first mask layer, to create one or more openings in the non-conducting mask layer that expose first regions of the first p-doped portion below. The step of removing a portion of the first mask layer may involve photolithography, wet etching or dry etching, for example inductively coupled dry etching (ICP-RIE).

The lateral size (length and width of the opening through the mask layer) and shape of the exposed region(s) controls the lateral size and shape of the second LED structure to be grown in the exposed region.

The exposed region(s) of the first p-doped portion may be formed into any desired shape, and may be controlled by patterning and lithographically removing portions of the first mask layer. For example, the exposed regions may be circular, square, rectangular, hexagonal, or triangular in shape.

The size of the exposed region may be between 0.2 μm and 100 μm, preferably between 1 μm and 30 μm, particularly preferably between 2 μm and 10 μm.

In a preferred embodiment, the method involves removing a plurality of portions of the first mask layer to expose a plurality of exposed regions of the first p-doped portion, and then forming a plurality of porous regions and second LED structures—one on each exposed region.

Particularly preferably the size of the exposed region may be the size of a micro-LED. For example, the exposed region(s) may have a width and/or length (or diameter, if the exposed region is circular) of between 0.05 μm and 100 μm, preferably between 0.05 μm and 30 μm, particularly preferably less than 10 μm, for example between 0.1 μm and 10 μm or between 0.5 μm and 10 μm. In preferred embodiments the exposed regions may have a length, width or diameter of less than 50 μm, or less than 40 μm, or 30 μm, or 20 μm or 10 μm. Particularly preferably the exposed regions may have a width or diameter of less than 10 μm, so that the LED structures grown in the exposed regions form micro-LED pixels of less than 10 μm in size.

Once the first exposed region of the first p-doped portion has been formed in the dielectric mask layer, the porous region can be formed in the exposed region, and then the second LED structure can be grown on the porous region.

The lateral dimensions of the porous region and the second LED structure, including the second n-doped portion, second light-emitting region and second p-doped portion, are preferably the same as that of the exposed region, as the second LED structure is grown in the exposed region and inherits its lateral size. This means that the second LED can be grown at an appropriate size without requiring an etching step to reduce the lateral dimensions of the LED structure.

Once the second LED structure has been formed, a second electrically-insulating mask layer may be formed over both the first LED structure and the second LED structure. The second electrically-insulating mask layer may be termed a second passivation layer. The second mask layer may be formed from one of: $SiO_2$, SiN, SiON, aluminium oxide, tantalum oxide, hafnium oxide, or a combination thereof. The second mask layer may be deposited by PECVD, sputtering, ALD, evaporation, in-situ MOCVD, or any other conventional technique.

The second mask layer covers the surfaces and sidewalls of the first LED structure as well as the connecting layer.

The thickness of the second mask layer may be between 20-2000 nm. The second mask layer may have a thickness of between 20 nm and 1800 nm, preferably between 200 nm and 1500 nm, particularly preferably between 500 nm and 1000 nm.

The first mask layer may be removed prior to deposition of the second mask layer. The first mask layer may be removed via wet etching using buffered oxide etching chemistry.

Once the first LED structure and the second LED structure have been covered with the second mask layer, the method may comprise the steps of removing portions of the semiconductor structure and forming electrical connections with each semiconductor structure.

The method may comprise the step of exposing the first p-doped portion of the first LED structure and the second p-doped portion of the second LED structure, and forming electrical contacts in the exposed regions of the p-doped portions. The p-doped portions may be exposed by creating openings in the second mask layer, for example by photolithography, wet etching or dry etching, for example inductively coupled dry etching (ICP-RIE).

The method may comprise the step of exposing the first n-doped portion of the first LED structure and the second n-doped portion of the second LED structure, and forming electrical contacts in the exposed regions of the n-doped portions. The n-doped portions may be exposed by creating openings in the second mask layer and optionally through overlying layers of the first and/or second LED structures, for example by photolithography followed by a dry etch process such as inductively coupled dry etching (ICP-RIE), only reactive ion etch process or a neutral beam etch process.

The method may comprise the step of etching the first LED structure into a plurality of mesas. The step of etching the first LED structures may create access to the first n-doped portion of the first LED structure, so that an electrical n-contact may be formed.

A variety of first and second LED structures may be used while obtaining the benefit of the present invention. All such LED structures typically comprise an n-doped portion, a light-emitting region and a p-doped portion, and optionally further layers of semiconductor material that are typical in LED epitaxy.

Exemplary LED structures suitable for use as either the first or second LED structures in the present invention are described below. The following description is applicable to both the first LED structure and the second LED structure.

In a preferred embodiment, the n-doped portion of each LED structure is grown on the exposed region of the connecting layer, so that the n-doped portion is in direct contact with the n-doped connecting layer.

The n-doped portion may comprise an n-doped layer of III-nitride material. The n-doped layer may comprise a III-nitride layer containing indium, or a stack of thin III-nitride layers with or without indium, or a bulk layer or stack of III-nitride layers with a variation in atomic percentage of indium across the layer or stack. For example, the n-doped region may be a layer of n-GaN, or a layer of n-InGaN, or alternatively the n-doped region may be a stack of n-GaN/n-InGaN alternating layers, or a stack of n-InGaN/n-InGaN alternating layers having different quantities of indium in alternating layers.

The Indium atomic percentage in the n-doped portion may vary between 0.5-25%. The total thickness of the n-doped portion may vary between 2 nm-200 nm, for example between 10 nm and 150 nm, or between 20 nm and 100 nm. If the n-doped portion comprises a stack of layers, then the thickness of each individual layer in the stack may preferably vary between 1 nm and 40 nm, or between 5 nm and 30 nm.

The n-doped portion may have an n-type doping concentration between $1\times10^{17}$ $cm^{-3}$-$5\times10^{20}$ $cm^{-3}$.

After growth of the n-type portions of the LED structure in the exposed regions, the light-emitting region of the LED is overgrown on the n-type portion.

The light-emitting region in the first and/or second LED structures may comprise one or more III-nitride light-emitting layers, preferably indium gallium nitride (InGaN) light-emitting layers. The light-emitting layer or each light-emitting layer preferably comprises a quantum well, or a nanostructured layer comprising quantum structures such as quantum dots, fragmented or discontinuous quantum wells.

The quantum wells and barriers are preferably grown in a temperature range of 600-800 C, according to known techniques.

The light-emitting layer or each light-emitting layer preferably comprises a III-nitride material with an atomic indium content of between 10-40%. The indium content of the light-emitting layers may be selected at different levels depending on the emission wavelength that is desired for the first and second LED structures. In preferred embodiments the light-emitting layer may have an indium content of between 12-18%, preferably above 13%, or an indium content between 20-30%, preferably above 22%, or an indium content between 30-40%, preferably above 33%.

The first light emitting region of the first LED structure preferably contains a different atomic indium content from the second light emitting region of the second LED structure, with the result that the first and second LED structures emit light at different wavelengths.

In one preferred embodiment, the one or more light-emitting layers in the first LED structure may have the composition $In_xGa_{1-x}N$, in which $0.10 \le x \le 0.30$, preferably $0.18 \le x \le 0.30$, particularly preferably $0.20 \le x \le 0.30$.

In a preferred embodiment, the target electroluminescence (EL) emission wavelength of the first LED structure may be between 515 nm-550 nm, preferably 530 nm.

In some preferred embodiments, the first LED structure and the second LED structure are selected so that the first emission wavelength is shorter than the second emission wavelength.

In a preferred embodiment, the one or more light-emitting layers in the second LED structure may have the composition $In_yGa_{1-y}N$, in which $0.20 \le y \le 0.40$, preferably $0.26 \le y \le 0.40$, particularly preferably $0.30 \le y \le 0.40$.

In some preferred embodiments, the target EL emission wavelength of the second LED structure may be between 570 nm and 630 nm, preferably more than 575 nm.

In another preferred embodiment, one or more light-emitting layers in the first LED structure may have the composition $In_xGa_{1-x}N$, in which $0.10 \le x \le 0.30$, preferably $0.12 \le x \le 0.25$, particularly preferably $0.15 \le x \le 0.20$. In particularly preferred embodiments the first LED structure may be configured to emit light at a peak wavelength between 415 and 500 nm under electrical bias thereacross, preferably between 430 and 470 nm under electrical bias thereacross.

In preferred embodiments, each light-emitting region comprises one or more InGaN quantum wells, preferably between 1 and 7 quantum wells. The thickness of each quantum well layer may vary between 1.5-8 nm.

The quantum wells may or may not be capped with a thin (0.5-3 nm) III-nitride layer.

The III-nitride barrier layer may contain one or a combination of these elements: Al, Ga, In (ternary or quaternary layer).

The LED structures may comprise a cap layer of III-nitride material between the quantum wells and the p-doped portion, preferably in which the cap layer is undoped and has a thickness of between 5 nm and 30 nm.

The p-doped portions of the first and second LED structures are overgrown above the light-emitting regions, and comprises a p-doped III-nitride layer and a p-doped aluminium gallium nitride layer positioned between the p-doped III-nitride layer and the light emitting region. The p-doped aluminium gallium nitride layer is an electron-blocking-layer (EBL) between the cap layer and the p-type layer, in which the electron-blocking-layer contains 5-25 at % aluminium, preferably in which the electron-blocking-layer has a thickness of between 10 nm and 100 nm, or between 20 nm and 50 nm.

The p-doped III-nitride layer preferably has a p-type doping concentration of between $5\times10^{18}$ $cm^{-3}$-$8\times10^{20}$ $cm^{-3}$. The p-doped III-nitride layer may contain In and Ga, and may be between 20-200 nm thick, preferably between 50-100 nm thick. The doping concentration may vary across this layer and can have a spike in doping levels in the last 10-30 nm of the layer. For activation of Mg acceptors, the structure may be annealed inside of MOCVD reactor or in an annealing oven. The annealing temperature may be in the range of 700-850 C in N2 or in N2/O2 ambient.

As both the EBL and the p-doped layer are p-type doped, these layers may be referred to as the p-doped portion.

The method may comprise the further step of, after the second LED structure has been formed, removing a portion of the second mask to expose a region of the first LED structure; and forming an electrical contact in the exposed region of the first LED structure, preferably forming an electrical connection with the p-doped portion of the first LED structure. An electrical connection may also be formed with the p-doped portion of the second LED structure.

Portions of the first and second mask layers may be removed by wet etching, dry etching, or a combination of both. For wet etching, buffered oxide etch, diluted hydrofluoric acid, phosphoric acid or a mixture of these can be used.

Forming a p-doped portion electrical connection may comprise the step of depositing transparent conducting oxide (e.g ITO, ZnO on other compatible oxides) or metal layers on the p-type region of the first and second LED structures. The covering can be done with a single step or multiple steps. The metals can cover the p-type regions completely or partially. The metal may contain Ti, Pt, Pd, Rh, Ni, Au, Ag etc. The thickness of the complete metal stack can be between 200 nm and 2000 nm, or between 500 nm and 1000 nm.

The structuring can be done be using standard semiconductor processing methods that included resist coating, photolithography and lift off. This can be combined with dry or wet structuring so that the conducting metal layer fully or only partially covers the top surface of the p-doped regions.

Forming an n-doped portion electrical connection may comprise the step of depositing a metal contact on the exposed region of the n-type connecting layer, preferably by depositing metal in the opening created in the second mask layer. The covering can be done with a single step or multiple steps. The metal may contain Ti, Pt, Pd, Rh, Ni, Au, Ag etc. The thickness of the metal stack contact can be between 200 nm and 2000 nm for example, or between 500 nm and 1000 nm.

Third LED Structure

In a particularly preferred embodiment, the method comprises the step of forming a third LED structure over the first LED structure, the third LED structure preferably being configured to emit light under an electrical bias thereacross at a third emission wavelength different from the first and second emission wavelengths. The third LED structure may be formed over the first p-doped portion of the first LED structure.

Particularly preferably, the first LED may be a blue LED structure which emits light at an emission wavelength under electrical bias of between 400-500 nm, preferably between 430-470 nm.

The second LED structure may preferably be a green LED structure which is configured to emit light at an emission wavelength under electrical bias of between 500-600 nm, preferably 520-540 nm. However, due to the fact that the second LED is grown over a porous region, the actual emission wavelength of the second LED will be shifted to longer wavelengths than would usually be the case.

The method may comprise the step of, prior to forming the second LED structure, forming a non-porous region of III-nitride material over the first p-doped portion of a first LED structure, the non-porous region being arranged in the same plane as the porous region.

The third LED structure may preferably be formed over the non-porous region. Thus, even if the third LED structure has the same structure and composition as the second LED structure, the two will emit at different wavelengths due to the wavelength shift that the porous region induces in the second LED structure only.

In a preferred embodiment, the second LED structure may be formed over both the porous region and the non-porous region. The method may then comprise the step of dividing the second LED structure into two discrete LED structures, or "mesas", positioned over the first LED structure. This dividing step may be performed by conventional processes for etching channels through a semiconductor structure. The second LED structure may be divided into: a second LED structure which is positioned over the porous region, and a third LED structure which is positioned over the non-porous region.

The method of the present invention may thus advantageously be used to provide an LED device with three different emission wavelengths, by forming a third LED structure over the first LED structure, but not over the porous region.

In another possible embodiment, after forming the second LED structure over the porous region, the second LED structure may be passivated by covering it in a second mask layer of dielectric material. A portion of the second mask layer, and any underlying first mask layers, may then be removed to expose a third exposed region of the n-doped connecting layer. A third LED structure, configured to emit light at a third wavelength different from the first and second wavelengths, may then be formed on the third exposed region.

The steps of making electrical contacts to all three LED structures may then be performed as described above.

The third LED structure may be an LED structure as described above, which is configured to emit wavelength at a different wavelength from the first and second LED structures. In a particularly preferred embodiment, the LED device may comprise one red-, one green- and one blue-emitting LED structure.

PREFERRED EMBODIMENT

In a preferred embodiment, the present method of manufacturing an LED may comprise the following steps:

Step 1—A non-porous template layer of III-nitride material is formed on a substrate by depositing a layer of GaN on a substrate.

Step 2—A first LED structure is formed on the template layer by depositing an n-doped region of n-(Al,In)GaN, and then overgrowing a Quantum Well (QW) active light emitting region (which can include multiple quantum wells) on the exposed section of n-(Al,In)GaN. The quantum wells could be InGaN, AlGaN, InN, InAlN, AlInGaN, while the quantum barrier surrounding the quantum well layer could be GaN, AlN, AlGaN, AlInGaN, InAlN. Quantum Wells, their structures, and their functions, are well known in the art. The lateral dimensions of the QWs may be the same as those of the template layer.

Step 3—A layer of p-(Al,In)GaN (heavily doped p-type (Al,In)GaN) is deposited on the top of the Quantum Well region. The lateral dimensions of the layer of p-GaN are the same as those of the QW region. The p-GaN, the QW region and the n-doped region therefore form a first LED structure on the substrate.

Step 4—A first mask layer of dielectric material, for example SiO2, is deposited on top of the first LED structure, so that the mask layer covers the p-GaN layer. This second layer of dielectric material is the passivation layer for the first LED structure.

Step 5—The first mask layer is patterned by lithography, or nano imprint, or any other suitable technique, and sections of the first mask layer are then removed by wet chemical or dry etching process. Removing some of the first mask layer exposes an exposed region of the underlying p-GaN layer, without damaging the passivated first LED structure. The removed area of dielectric is preferably the shape and size of a micro-LED, for example 100 μm×100 μm or smaller.

Step 6—A porous region is formed in the exposed region on the p-GaN layer, by depositing a region of n-doped III-nitride material, for example n-GaN, and electrochemically porosifying that n-doped material using known porosification techniques.

Step 7—A second LED structure is grown on the porous region of n-GaN. The second LED structure may have a layered structure similar to that described above for the first LED structure, but the second LED structure is configured to emit light at a different wavelength than the emission wavelength of the first LED structure.

Step 8—Once the second LED structure has been formed, both first and second LED structures are passivated by depositing a second dielectric mask layer to cover the side-walls and surfaces of the LED structures.

Step 9—Sections of the second mask layer are removed by wet chemical or dry etching processes to expose the p-(Al, In)GaN layers of the first and second LED structures.

Step 10—Electrical p-contacts are deposited on the exposed sections of p-(Al,In)GaN of both the first LED structure and the second LED structure, so that the p-contact is in electrical contact with the p-(Al,In)GaN layers of the LED structures.

Step 11—In order to make electrical n-contacts with the n-doped connecting layer, one or more regions of the second mask layer are removed to expose regions of the n-doped portions of the first and second LED structures. Electrical n-contacts are then made with the n-doped portions by depositing metal contacts according to known techniques.

This method means that LED structures that emit at two different wavelengths are provided on the same substrate.

If desired, layers of the semiconductor structure may be porosified by electrochemical etching as set out in international patent applications PCT/GB2017/052895 (published as WO2019/063957) and PCT/GB2019/050213 (published as WO2019/145728).

The method set out above relates to a p-side light out LED configuration.

A similar method may be used to manufacture an n-side light out micro-LED by incorporating a "flip-chip" step and bonding the micro-LED to a silicon CMOS backplane.

SiO2 is only an example of a dielectric suitable for masking and passivation, but other dielectrics may alternatively be used.

The layers of semiconductor material may be deposited by epitaxial growth. The layers described may be formed by molecular beam epitaxy (MBE), metalorganic chemical vapour deposition (MOCVD) (also known as metalorganic vapour phase epitaxy (MOVPE)), hydride vapour phase epitaxy (HVPE), ammonothermal processes, or other conventional processes suitable for growing III-nitride materials.

Manufacturing an Array of LEDs

According to a second aspect of the present invention there is provided forming a first array of first LED structures, and forming a second array of second LED structures over the first array of first LED structures, in which at least one of the first array or second array of LED structures is positioned over a porous region of III-nitride material.

The method may comprise the steps of forming the first array of LED structures over the porous region, and forming the second array of LED structures over the first LED structures.

The method may alternatively comprise the steps of:

forming the porous region of III-nitride material over the first LED structures; and forming the second LED structures over the porous region of III-nitride material.

The method may comprise the steps of forming a first LED structure and a second LED structure over the first LED structure, and dividing the LED structures into a first array of first LED structures and a second array of LED structures.

The present invention may provide a method of manufacturing an array of LEDs, comprising the steps of:

forming a porous region of III-nitride material over a first LED structure (preferably over a first p-doped portion of the first LED structure); and forming an array of second LED structures over the porous region of III-nitride material.

Preferably the method comprises the steps of:

forming a first electrically-insulating mask layer over the first p-doped portion of a first LED structure;

removing a plurality of portions of the first mask layer to expose an array of exposed regions of the first p-doped portion;

forming a porous region of III-nitride material on each of the exposed regions in the array on the first p-doped portion; and forming an array of second LED structures by forming a second LED structure over each of the plurality of porous regions of III-nitride material.

The method may comprise the steps of dividing the first LED structure into a plurality of first LED structures, preferably by etching channels in the first LED structure.

The method of manufacturing an array of LEDs preferably comprises the method of the first aspect, in which a plurality of exposed regions of the first p-doped portion are formed, and a plurality of porous regions and second LED structures are formed in those exposed regions. By removing sections of the mask layer to expose an array of exposed regions, the layout of the array of second LED structures may be designed to have the desired dimensions and density of pixels formed by the LEDs.

Preferably the LED structures may be micro-LED structures.

The array of exposed regions is preferably a uniform arrangement or pattern of identical exposed regions. For example, the array may comprise multiple rows and columns of regularly-spaced exposed regions.

As the method involves forming a porous region and then a second LED structure on each of the exposed regions of the array of exposed regions, this involves forming a plurality of porous regions, and a plurality of LED structures.

When exposing the array of exposed regions, the distance between adjacent exposed regions may preferably be between 500 nm and 30000 nm, or between 750 nm and 20000 nm, or between 1000 nm and 15000 nm.

The array of LEDs may advantageously be formed on a single substrate. The plurality of second LED structures may be formed simultaneously, using deposition steps which deposit layers of semiconductor material on each porous region at the same time.

The method may optionally include the step of forming a third electrically-insulating mask layer over the first and second LED structures and the n-doped connecting layer, removing a portion of the third mask layer to expose a third array of exposed regions of the n-doped connecting layer, and forming a third LED structure, configured to emit light at a third emission wavelength different from the first and second emission wavelengths, on each exposed region of the third array on the n-doped connecting layer.

Using this method, an array of differently coloured LEDs or micro-LEDs may be formed on the same wafer.

The method of manufacturing an array of LEDs may comprise the step of etching the first LED structure into a plurality of mesas, or etching the first LED structure into an array of first micro-LED structures, by forming channels in the first LED structure to divide the structure into a plurality of discrete regions.

The method of the second aspect may advantageously include any and all of the features described above in relation to the first aspect of the invention.

Manufacturing a Three Colour LED Device

According to a third aspect of the present invention there is provided a method of manufacturing a three colour LED device, comprising the steps of:

forming a porous region of III-nitride material;

forming a first LED structure over the porous region of III-nitride material;

forming a second LED structure over the first LED structure; and forming a third LED structure over the second LED structure.

According to a further aspect of the present invention there is provided a method of manufacturing a three colour LED device, comprising the steps of:

forming a porous region of III-nitride material over a first LED structure;

forming a non-porous region of III-nitride material over the first LED structure, the non-porous region being arranged in the same plane as the porous region;

forming a second LED structure over the porous region of III-nitride material; and forming a third LED structure over the non-porous region of III-nitride material.

Preferably the first LED structure is configured to emit light at a first emission wavelength, the second LED structure is configured to emit light at a second emission wavelength different to the first emission wavelength, and the third LED structure is configured to emit light at a third emission wavelength different from the first emission wavelength and the second emission wavelength.

In a preferred embodiment, the second LED structure is identical to the third LED structure, and the second and third LED structures are formed simultaneously.

Preferably the second and third LED structures are configured to emit light at an emission wavelength under electrical bias of between 500-600 nm, preferably 520-540 nm, and in which the first LED structure is configured to emit light at an emission wavelength of 400-500 nm, preferably 430-470 nm, under electrical bias.

LED Device

Another aspect of the invention relates to an LED device, which may be a an LED device or a micro-LED device made by the method set out above.

According to a fourth aspect of the present invention there is provided an LED device comprising a second LED structure positioned over a first LED structure, in which at least one of the first or second LED structures is positioned over a porous region of III-nitride material.

In one possible embodiment, the first LED structure is positioned over the porous region, and the second LED structure is positioned over the first LED structure.

In another embodiment, the LED device may comprise:

a first LED structure, a porous region of III-nitride material on the first LED structure, and a second LED structure on the porous region of III-nitride material.

The first LED structure preferably has a first p-doped portion, and the porous region of III-nitride material is preferably positioned on or over the first p-doped portion of the first LED structure.

The LED device is preferably an LED device manufactured using the method described above in relation to the first aspect of the invention. The LED device comprises two LED structures that emit at different wavelengths, and so may be termed a multi-colour LED, a multi-colour LED device, or a multi-wavelength LED device.

The porous region may be a porous layer, such that the method comprises the step of forming a second LED structure over a porous layer of III-nitride material. In some embodiments, the porous region may comprise a plurality of porous layers, and optionally a plurality of non-porous layers. In preferred embodiments of the invention, the porous region is a stack of alternating porous and non-porous layers, with the top surface of the stack defining the top of the porous region, and the bottom surface of the stack defining the bottom of the porous region. The second LED structure may be formed over a porous region comprising a stack of porous layers of III-nitride material.

In preferred embodiments, the second LED structure is positioned over a stack of multiple porous layers of III-nitride material. Thus, rather than being a single porous layer of III-nitride material, the porous region may be a stack of layers of III-nitride material in which at least some layers are porous.

The stack of porous layers may preferably be a stack of alternating porous and non-porous layers. Preferably the stack comprises between 2 and 50 pairs of porous and non-porous layers, stacked one on top of another. The porous layers may preferably have a thickness of between 2 nm and 200 nm, and the non-porous layers may preferably have a thickness of between 2 nm and 180 nm.

Preferably the porous region, or each porous layer in the stack, has a porosity of between 10% and 90% porosity, or between 20% and 70% porosity.

The LED device preferably comprises a non-porous intermediate layer of III-nitride material porous region between the porous region and the n-doped III-nitride connecting layer. As the porous region is preferably formed by electrochemical porosification through a non-porous layer of III-nitride material, using the method of PCT/GB2017/052895 (published as WO2019/063957) and PCT/GB2019/050213 (published as WO2019/145728), the non-porous layer of III-nitride material typically forms a non-porous intermediate layer which remains on top of the porous region. The non-porous intermediate layer may advantageously provide a smooth surface for overgrowth of the connecting layer during manufacture.

The LED device may comprise an intermediate layer of non-porous III-nitride material positioned between the porous region and the connecting layer. The intermediate layer preferably has a thickness of between 1 nm and 3000 nm, preferably between 20 nm and 2000 nm, or between 50 nm and 1000 nm.

The n-doped connecting layer of III-nitride material preferably has a thickness of between 100 nm and 2000 nm, or between 200 nm and 1000 nm. The n-doped connecting layer of III-nitride material may have a doping concentration between $1\times10\ cm^{-3}$-$5\times10^{20}\ cm^{-}3$ and preferably has an n-type charge carrier concentration of at least $1\times10^{18}\ cm^{-3}$.

The LED structures may have any desired shape, as the footprint of the LED structures may be controlled during manufacturing by patterning and lithographically removing portions of the mask layer. For example, the footprints of the LED structures (seen in plan-view) may be circular, square, rectangular, hexagonal, or triangular in shape.

The LED structures may have lateral dimensions that are classed as a "micro-LED". For example, the LED structures may have a width and/or length (or diameter, if the LED is circular) of between 0.05 μm and 100 μm, preferably between 0.05 μm and 30 μm, particularly preferably less than 10 μm, for example between 0.1 μm and 10 μm or between 0.5 μm and 10 μm. In preferred embodiments the LED structure may have a length, width or diameter of less than 50 μm, or less than 40 μm, or 30 μm, or 20 μm or 10 μm. Particularly preferably the LED structures may have a width or diameter of less than 10 μm, so that the LED structures form micro-LED pixels of less than 10 μm in size.

The first LED structure comprises:

a first n-doped portion;

a first p-doped portion; and a first light emitting region located between the first n-doped portion and the first p-doped portion.

The second LED structure comprises:

a second n-doped portion;

a second p-doped portion; and a second light emitting region located between the second n-doped portion and the second p-doped portion.

When the porous region is positioned over the first LED structure, the second n-doped portion of the second LED structure is preferably in contact with the porous region of III-nitride material.

The LED device may additionally comprise a non-porous region of III-nitride material positioned over the p-doped portion of the first LED structure, the non-porous region preferably being positioned in the same plane, or in the same layer, as the porous region.

The LED device may additionally comprise a third LED structure positioned over the first LED structure, preferably over the first p-doped portion of the first LED structure, in which the third LED structure is configured to emit light at a third emission wavelength different from the first and second emission wavelengths. Particularly preferably, the third LED structure is positioned over the non-porous region of III-nitride material over the first LED structure. As explained above, positioning the second LED structure over a porous region results in a wavelength shift in the electroluminescence emission wavelength of the second LED structure. This advantageously allows the second LED structure to emit light at longer wavelengths than would otherwise be possible.

The LED device may alternatively comprise a second porous region of III-nitride material positioned over the p-doped portion of the first LED structure, the second porous region preferably being positioned in the same plane, or in the same layer, as the porous region. The second porous region may preferably have a different porosity from the porosity of the porous region, so that the strain relaxation effect provided to overgrown semiconductor structures will be different for the third LED structure grown over the second porous region. The third LED structure may optionally be positioned over the second porous region of III-nitride material, above the first p-doped portion of the first LED structure.

Where a third LED structure is provided, the third LED structure may advantageously emit at a third wavelength, so that the LED device emits at three different wavelengths.

As explained above in relation to the first aspect of the invention, the LED structure may take a variety of different forms having layers of different thickness, composition and charge carrier concentration.

The features of the LED device described above in relation to the first aspect of the invention apply equally to the LED device of the third aspect.

The first and/or second LED structures may comprise an active layer which may be a Quantum Well, or a Quantum layer (for example a porosified Quantum Well containing a plurality of 3D quantum structures). The Quantum Well could be InGaN, AlGaN, InN, InAlN, AlInGaN, while the quantum barrier surrounding the quantum well layer could be GaN, AlN, AlGaN, AlInGaN, InAlN.

The LED structures may have lateral dimensions (Length and width) smaller than 100 μm×100 μm all the way down to a few tens of nanometers or even smaller. In this context, the "height" of the LED is the dimension in the direction of intended light emission.

The first light emitting region may comprise one or more light-emitting layers with the composition $In_xGa_{1-x}N$, in which $0.10 \leq x \leq 0.30$, preferably $0.18 \leq x \leq 0.30$, particularly preferably $0.20 \leq x \leq 0.30$.

In another preferred embodiment, one or more light-emitting layers in the first LED structure may have the composition $In_xGa_{1-x}N$, in which $0.10 \leq x \leq 0.30$, preferably $0.12 \leq x \leq 0.25$, particularly preferably $0.15 \leq x \leq 0.20$. In particularly preferred embodiments the first LED structure may be configured to emit light at a peak wavelength between 415 and 500 nm under electrical bias thereacross, preferably between 430 and 470 nm under electrical bias thereacross.

The second light emitting region preferably comprises one or more light-emitting layers with the composition $In_yGa_{1-y}N$, in which $0.20 \leq y \leq 0.40$, preferably $0.26 \leq y \leq 0.40$, particularly preferably $0.30 \leq y \leq 0.40$.

The first and second light emitting regions preferably contain different atomic indium contents, and therefore have different emission wavelengths.

The first and light-emitting regions preferably comprise one or more InGaN quantum wells, particularly preferably between 1 and 7 quantum wells.

The LED device may optionally comprise further LED structures configured to emit light at wavelengths different from the first and second wavelengths. For example. The LED device may additionally comprise a third LED structure positioned above the first LED structure.

Particularly preferably the third LED structure is not positioned over a porous region, or alternatively the third LED structure may be positioned over a third porous region having a different porosity than the first porous region.

In a preferred embodiment, one or more light-emitting layers in the third LED structure have the composition $In_zGa_{1-z}N$, in which $0.20 \leq z \leq 0.40$, preferably $0.26 \leq z \leq 0.40$, particularly preferably $0.30 \leq z \leq 0.40$. Particularly preferably the third LED structure may emit green light under an applied electrical bias thereacross.

Array of LEDs

According to a fifth aspect of the present invention there is provided an array of LEDs. The array of LEDs may comprise a plurality of LED devices according to the third aspect of the invention, formed on a shared substrate, such as a single semiconductor wafer.

The invention may provide an array of LEDs, comprising:

a first array of first LED structures, and a second array of second LED structures positioned over the first LED structures, in which the first array and/or the second array of LED structures are positioned over one or more porous regions of III-nitride material.

The invention may provide an array of LEDs, comprising: an array of first LED structures, porous regions of III-nitride material on at least some of the first LED structures, and a plurality of second LED structures on the porous regions of III-nitride material.

An array of LEDs is an ordered series or arrangement of LEDs, for example a regular formation of multiple rows and columns each containing a plurality of LEDs.

The array of LEDs may be an array of LEDs manufactured using the method of the second aspect of the invention.

Preferably the array is an array of micro-LEDs which emit light of at least two different colours due to the respective arrays of first and second LED structures.

The array of LEDs may additionally comprise a plurality of third LED structures configured to emit light at a third emission wavelength different from the first and second emission wavelengths.

Three Colour LED Device

According to a sixth aspect of the present invention there is provided a three colour LED device, comprising:

a first LED structure, configured to emit light at a first emission wavelength, a second LED structure, configured to emit light at a second emission wavelength different from the first emission wavelength, positioned over the first LED structure, and a third LED structure, configured to emit light at a third emission wavelength different from the first and second emission wavelengths, positioned over the first LED structure, in which at least one of the first, second and third LED structures is positioned over a porous region of III-nitride material.

In one preferred embodiment, the first LED structure is positioned over the porous region of III-nitride material.

In another preferred embodiment, the second LED structure is positioned over a porous region of III-nitride material, the porous region of III-nitride material being positioned between the second LED structure and the first LED structure.

In another possible embodiment, the first LED structure may be positioned over a first porous region of III-nitride material, and the second LED structure may be positioned over a second porous region of III-nitride material, the second porous region of III-nitride material being positioned between the second LED structure and the first LED structure. The second porous region may have a different porosity from the first porous region. Particularly preferably the device is a red-green-blue (RGB) LED device, and the first, second and third LED structures are configured to emit red, green and blue light under an applied electrical bias.

The second LED structure is preferably positioned over the porous region of III-nitride material, and the third LED structure is preferably not positioned over the porous region of III-nitride material. The second and third LED structures may therefore not experience the same shift in emission wavelength that is experienced by LED structures overgrown on porous regions.

The third LED structure may be identical to the second LED structure, and the second and third LED structures may emit light at different emission wavelengths due to the porous region beneath the second LED structure.

In a preferred embodiment, the second LED structure may be an LED structure for emitting at a peak wavelength of 515-540 nm under an electrical bias applied across the LED structure. The porous region of III-nitride material under the second LED structure may then shift the emission wavelength of the first light-emitting region of the LED structure to between 600 and 650 nm. Thus the second LED structure may emit red light.

In a preferred embodiment, the third LED structure may also be an LED structure for emitting at a peak wavelength of 515-540 nm under an electrical bias applied across the LED structure. Preferably the third LED structure is not positioned over a porous region, so the third LED structure emits at the expected peak wavelength of 515-540 nm under an electrical bias. Thus the third LED structure may emit green light.

One or more light-emitting layers in the second LED structure and/or the third LED structure have the composition $In_yGa_{1-y}N$, in which $0.10 \le y \le 0.40$, preferably $0.18 \le y \le 0.30$, particularly preferably $0.22 \le y \le 0.30$.

Preferably the third LED structure is positioned over a non-porous region of III-nitride material above the first p-doped portion of the first LED structure.

The first LED structure may be configured to emit light at a peak wavelength between 400 and 500 nm, preferably 430 nm to 470 nm, under electrical bias thereacross. Particularly preferably the first LED structure may be a blue LED structure for emitting blue light.

One or more light-emitting layers in the first LED structure may for example have the composition $In_xGa_{1-x}N$, in which $0.10 \le x \le 0.30$, preferably $0.12 \le x \le 0.25$, particularly preferably $0.15 \le x \le 0.20$.

In a particularly preferred embodiment, the first, second and third LED structures are configured so that:

the first LED structure emits light at a peak wavelength between 400 and 500 nm under electrical bias thereacross;

the second LED structure emits light at a peak wavelength between 600 and 650 nm under electrical bias thereacross; and the third LED structures emits light at a peak wavelength between 515 and 550 nm under electrical bias thereacross.

All of the features described above in relation to any of the first, second, third, fourth, fifth or sixth aspects of the invention are equally applicable to the other aspects of the invention.

BRIEF DESCRIPTION OF THE DRAWINGS

Specific embodiments of the invention will now be described with reference to the figures, in which:

FIG. 1—SUBSTRATE

A compatible substrate is used as a starting surface for epitaxy growth. The substrate may be Silicon, Sapphire, SiC, β-Ga2O3, GaN, glass or metal. The crystal orientation of the substrates can be polar, semi-polar or non-polar orientation. The substrate size may vary from 1 $cm^2$, 2 inch, 4 inch, 6 inch, 8 inch, 12 inch, 16 inch diameters and beyond, and the substrate may have a thickness of greater than 1 μm, for example between 1 μm and 15000 μm. Preferably the substrate is a semiconductor wafer. An advantage of the present invention is that an array of micro-LEDs may be manufactured simultaneously on a fully sized semiconductor wafer. The illustrated method may be used to manufacture arrays of many micro-LEDs simultaneously on the same wafer.

FIG. 2—TEMPLATE LAYERS

A template layer 1 or stack of template layers of III-nitride material is epitaxially grown on the substrate. The III-nitride layer may contain one or a combination of these elements: Al, Ga, In (binary, ternary or quaternary layer).

The thickness of the III-nitride template layer is preferably at least 10 nm, or at least 50 nm, or at least 100 nm, for example between 10-10000 nm, preferably between 10 nm and 4000 nm.

In some preferred embodiments, the III-nitride layer may comprise a doped region having an n-type doping concentration between $1\times10^{17}$ $cm^{-3}$-$5\times10^{20}$ $cm^{-3}$. The III-nitride layer may also comprise an undoped layer (not shown) of III-nitride material over the doped region.

The doped region may terminate at the exposed upper surface of the III-nitride layer, in which case the surface of the layer will be porosified during electrochemical etching.

Preferably, the doped region of the III-nitride material is covered by an undoped intermediate (or "cap") layer of III-nitride material, so that the doped region is sub-surface in the semiconductor structure. The sub-surface starting depth (d) of the doped region may be between 1 nm and 3000 nm for example, or between 5 nm and 2000 nm.

In the example illustrated in FIGS. 1 to 22, the template layer 1 is non-porous, but in certain embodiments within the scope of the present invention the template layer may be porosified by known electrochemical porosification techniques to form a porous layer of III-nitride material.

FIG. 3—FIRST N-DOPED PORTION

Figures 1, 2, 3, 4, 5:
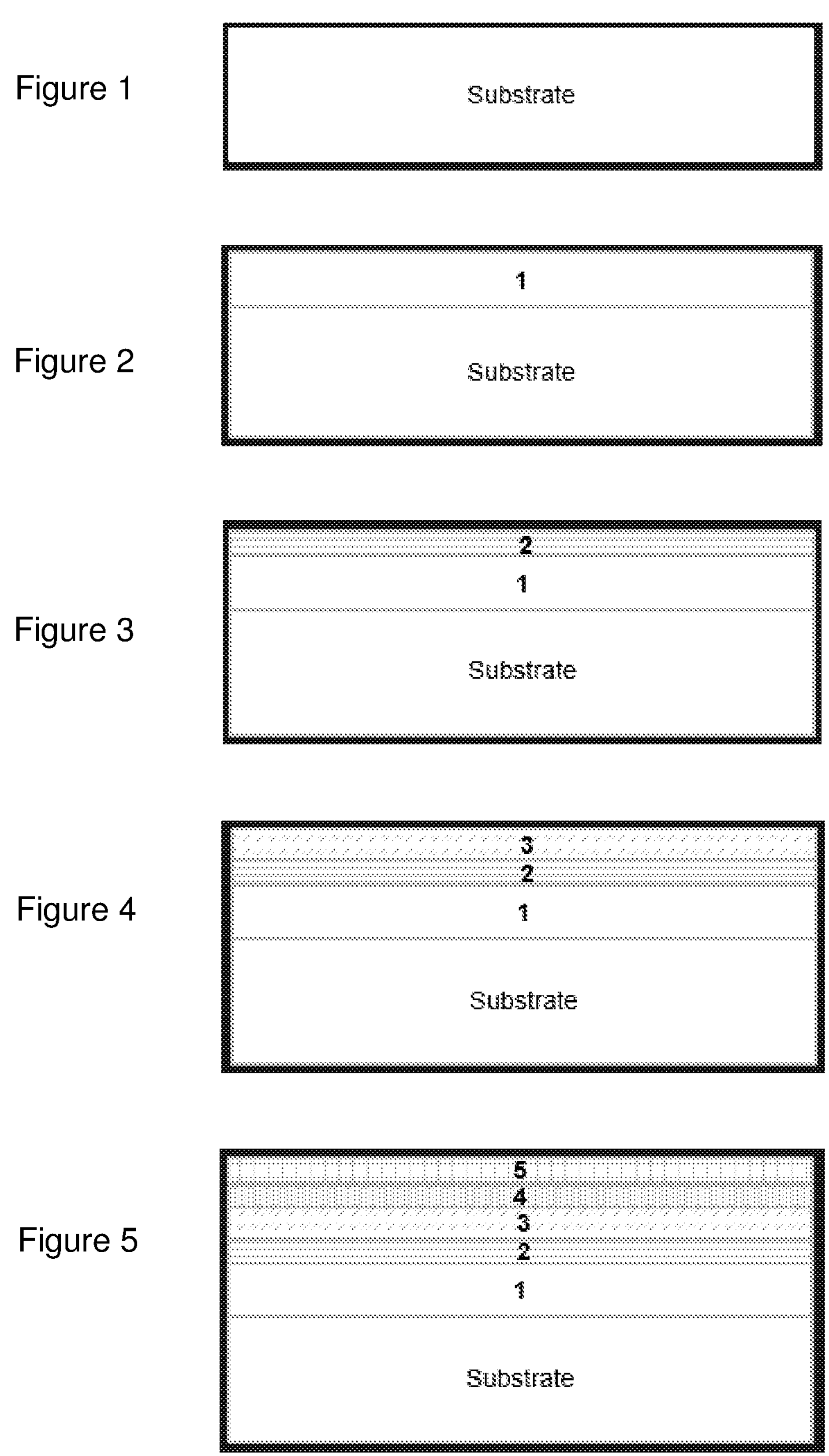
FIGS. 1-22 are schematic side-on cross-sections illustrating the steps of manufacturing an array of multi-coloured micro-LEDs according to a preferred embodiment of the present invention.

As shown in FIG. 3, the template layer 1 is overgrown with a first n-doped portion 2. The first n-doped portion 2 is a n-doped III-nitride layer with a thickness of between 2 and 200 nm.

The first n-doped portion 2 is formed of III-nitride material and may contain one or a combination of these elements: Al, Ga, In (binary, ternary or quaternary layer). The first n-doped portion 2 may contain between 0-30% Aluminium, 0.5-25% Indium along with Ga atoms. The first n-doped portion 2 is doped with suitable n-type dopant materials, e.g Si, Ge, C, O, and an n-type charge carrier concentration of between $1\times10^{17}$ $cm^{-3}$-$5\times10^{20}$ $cm^{-3}$ and preferably $>1\times10^{18}$ $cm^{-3}$.

FIG. 4—FIRST LIGHT EMITTING REGION

After growth of the first n-type layer 2, a first light-emitting region 3 is grown.

The first light-emitting region 3 may contain at least one light emitting layer. Each light emitting layer may be a quantum well (QW), preferably an InGaN quantum well (QW). Preferably the light emitting region may comprise between 1-7 quantum wells. Adjacent quantum wells are separated by barrier layers of III-nitride material having a different composition to the quantum wells.

The light emitting layer(s) may be referred to as "quantum wells" throughout the present document, but may take a variety of forms. For example, the light emitting layers may be continuous layers of InGaN, or the layers may be continuous, fragmented, broken layers, contain gaps, or nanostructured so that the quantum well effectively contains a plurality of 3D nanostructures behaving as quantum dots.

The quantum wells and barriers are grown in a temperature range of 600-800° C.

Each quantum well preferably consists of an InGaN layer with atomic indium percentage between 10-30%, preferably above 20%, and preferably below 30%.

The thickness of each quantum well layer may be between 1.5-8 nm, preferably between 1.5 nm and 6 nm, or between 1.5 nm and 4 nm.

The quantum wells may or may not be capped with a thin (0.5-3 nm) III-nitride QW capping layer, which may contain one or a combination of these elements: Al, Ga, In (ternary of quaternary layer).

The QW capping layer, which (if present) is the layer added immediately after QW growth, can be AlN, AlGaN of any A % 0.01-99.9%, GaN, InGaN of any In % 0.01-30%.

The III-nitride QW barriers separating the light emitting layers (quantum wells) may contain one or a combination of these elements: Al, Ga, In (ternary of quaternary layer).

The QW capping layer(s) and QW barriers are not indicated with individual reference numerals in the Figures, as these layers form part of the light emitting region 4.

The emission wavelength of the first LED structure may be tuned as desired, but in a preferred exemplary embodiment, the target emission wavelength of the light emitting region 4 under electrical bias is between 515 nm-550 nm, preferably 530 nm.

FIG. 5—CAPPED LAYER AND EBL

After growth of quantum wells a non-doped cap layer 4 is grown. Non-doped cap layer 4 may be termed a light-emitting-region cap layer, as this layer is formed after growth of the complete light emitting region, for example after the growth of the stack of QWs, QW capping layers and QW barrier layers.

The cap layer (light-emitting-region cap layer) 4 is a standard layer which is very well known in the growth schemes for III-nitride LEDs.

The thickness of cap layer can be between 5-30 nm, preferably between 5-25 nm or 5-20 nm.

Electron Blocking Layer (EBL)

After the cap layer 4, an electron blocking III-nitride layer 5 (EBL) containing Aluminium is grown. The thickness is of EBL can typically be between 10-50 nm. The Al % can be between 5-25% for example, though higher Al content is possible.

The EBL is doped with a suitable p-type doping material. The doping concentration can be between $5\times10^{18}$ $cm^{-3}$-$8\times10^{20}$ $cm^{-3}$.

FIG. 6—FIRST P-DOPED LAYER

A first p-doped layer 6 is grown above the electron blocking layer (EBL) 5.

The p-type region is preferably doped with Mg, and the p-type doping concentration of the p-type layer is preferably between $5\times10^{18}$ $cm^{-3}$-$8\times10^{20}$ $cm^{-3}$.

The p-doped III-nitride layer may contain In and Ga.

The doping layer is preferably between 20-200 nm thick, particularly preferably between 50-100 nm thick. The doping concentration may vary across the p-type layer and can have a spike in doping levels in the last 10-30 nm of the layer towards the LED surface, in order to allow better p-contact.

For activation of Mg acceptors in the p-doped layer, the structure may be annealed inside of MOCVD reactor or in an annealing oven. The annealing temperature may be in the range of 700-850 C in N2 or in N2/O2 ambient.

As both the EBL and the p-doped layer are p-type doped, these layers may be referred to as the first p-doped portion.

Layers 2-6 form the first LED structure.

FIG. 7—FIRST MASK LAYER

An electrically-insulating first mask layer 7 is then deposited on the wafer surface, to cover the first p-doped layer 6. The purpose of the mask layer 7 is to protect certain regions of the first LED structure in the next steps as a mask and to enable selective area epitaxy on top of this template.

This mask layer 7 can be $SiO_2$, SiN, or SiON. The thickness of this layer can be between 20 nm and 1000 nm, preferably between 100 nm and 700 nm.

The method used for deposition of this layer can be PECVD or sputtering for example.

FIG. 8—EXPOSED REGIONS OF THE FIRST P-DOPED LAYER

Standard lithographic or photolithographic techniques are used to create openings in the non-conducting first mask layer 7, to reveal first exposed regions on the surface of the first p-doped layer 6. The openings can be created either with a wet etching or a dry etching method.

In the schematic illustrations of the Figures, two first exposed regions are formed through the first mask layer 7. In a preferred embodiment, a regular array of a plurality of exposed regions are formed across a masked semiconductor wafer.

In a particularly preferred example photolithography is used to remove $SiO_2$ from two areas, which creates two exposed regions on the surface of the first p-doped layer 6 that are no longer covered by the first mask layer 7.

The size of the first exposed regions may be between 200 nm and 50000 nm, preferably between 500 nm and 10000 nm, or between 1000 nm and 8000 nm.

The distance between first exposed regions may be between 500 nm and 30000 nm, for example between 1000 nm and 10000 nm or between 5000 nm and 8000 nm.

The shape of the exposed regions can be circular, square, rectangular, hexagonal, triangular etc. The width or diameter of the openings are preferably less than 100 μm so that the LED structures formed on the exposed areas are classed as micro-LEDs. The exposed regions may preferably have a width of 0.05 μm-30 μm, particularly preferably of 10 μm or less.

Porous regions and second LED structures are subsequently grown in all of the first exposed regions of the first p-doped layer 6, so that these exposed regions become μLED pixels.

FIG. 9—N-DOPED REGION

After the first exposed regions of the first p-doped layer 6 are formed, an n-doped region 8 of III-nitride material is deposited in the first exposed regions only.

The n-doped III-nitride layer may contain one or a combination of these elements: Al, Ga, In (ternary of quaternary layer). The thickness of the n-doped region is between 10-4000 nm. The n-doped region 8 may have a doping concentration between $1\times10^{17}$ $cm^{-3}$-$5\times10^{20}$ $cm^{-3}$. The doped region may terminate at the surface of the n-doped region, or there may be an undoped region (not shown) of thickness 1-2000 nm arranged over the sub-surface doped region.

FIG. 10—POROSIFICATION TO FORM POROUS REGION

After it is deposited on the substrate, the n-doped III-nitride region 8 is porosified with a wafer scale porosification process as set out in international patent applications PCT/GB2017/052895 (published as WO2019/063957) and PCT/GB2019/050213 (published as WO2019/145728). During this process, the n-doped III-nitride material become porous, while any undoped region of III-nitride material does not become porous. The degree is porosity of the porous layers is controlled by the electrochemical etching process and may preferably be between 10%-90%, preferably between 20% and 70%.

Following the porosification step, the n-doped region 8 is converted into a porous region 9, preferably covered by a non-porous intermediate layer (not shown) of III-nitride material.

FIG. 11—SECOND N-DOPED PORTION

Once the porous regions 9 have been formed in each exposed region, n-doped layers 10 are overgrown on top of the porous regions 9. The n-doped layers 10 may contain between 0-30% Aluminium, 0.5-25% Indium along with Ga atoms.

Each n-doped layer 10 may be a bulk III-nitride layer containing Indium or a stack of thin III-nitride layers with or without indium, or with a variation in atomic percentage of indium across the bulk layer or the stack. The Indium atomic percentage may vary between 0.5-25%. The total thickness of the n-type layer 3 may vary between 2 nm and 200 nm, for example between 50 nm and 100 nm. If the stack is used then the thickness of individual layer in the stack may vary between 1-40 nm. The n-doped layer 3 may have an n-doping concentration of between $1\times10^{17}$ $cm^{-3}$-$5\times10^{20}$ $cm^{-3}$.

FIG. 12—SECOND LIGHT EMITTING REGION

After growth of the second n-type layers 10 on the porous regions 9, second light-emitting regions 11 are grown over each porous region 10.

The second light-emitting region 11 may contain at least one light emitting layer. Each light emitting layer may be a quantum well (QW), preferably an InGaN quantum well (QW). Preferably the light emitting region may comprise between 1-7 quantum wells. Adjacent quantum wells are separated by barrier layers of III-nitride material having a different composition to the quantum wells.

The light emitting layer(s) may be referred to as "quantum wells" throughout the present document, but may take a variety of forms. For example, the light emitting layers may be continuous layers of InGaN, or the layers may be continuous, fragmented, broken layers, contain gaps, or nanostructured so that the quantum well effectively contains a plurality of 3D nanostructures behaving as quantum dots.

The quantum wells and barriers are grown in a temperature range of 600-800° C.

Each quantum well preferably consists of an InGaN layer with atomic indium percentage between 20-40%, preferably above 26%, and preferably above 30%.

The thickness of each quantum well layer may be between 1.5-8 nm, preferably between 1.5 nm and 6 nm, or between 1.5 nm and 4 nm.

The quantum wells may or may not be capped with a thin (0.5-3 nm) III-nitride QW capping layer, which may contain one or a combination of these elements: Al, Ga, In (ternary of quaternary layer).

The QW capping layer, which (if present) is the layer added immediately after QW growth, can be AlN, AlGaN of any A % 0.01-99.9%, GaN, InGaN of any In % 0.01-30%.

The III-nitride QW barriers separating the light emitting layers (quantum wells) may contain one or a combination of these elements: Al, Ga, In (ternary of quaternary layer).

The QW capping layer(s) and QW barriers are not indicated with individual reference numerals in the Figures, as these layers form part of the second light emitting region 11.

The target PL emission wavelength of the second light emitting region 11 is between 570 nm-630 nm, preferably more than 575 nm. Thus the second light emitting region 11 has a different emission wavelength from the first light emitting region 3.

FIG. 13—CAPPED LAYER AND EBL

After growth of quantum wells a non-doped cap layer 12 and an electron blocking III-nitride layer 13 (EBL) is grown. These layers are similar or identical to cap layer 4 and EBL 5 described above.

FIG. 14—SECOND P-DOPED LAYER

A second p-doped layer 14 is grown above the electron blocking layer (EBL) 13. The second p-doped layer 14 may be similar or identical to p-type layer 6 described above.

The completed second LED structure, which is made up of layers 10-14, preferably has a PL emission wavelength between 570-630 nm, and an EL emission wavelength between 600-665 nm. Thus the second LED structure may be a red LED that emits red light when an electrical bias is applied.

FIG. 15—REMOVING FIRST MASK LAVER

The wafers are then processed to remove the first mask layer 7. This can be done via wet etching using buffered oxide etching chemistry. The preferable method is via wet chemical etch.

FIG. 16—SECOND MASK LAYER

Figure 16:
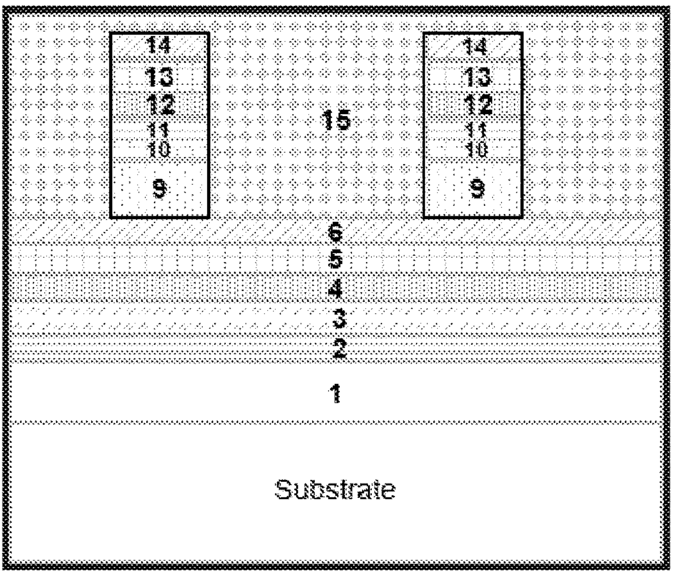
Figure 17:
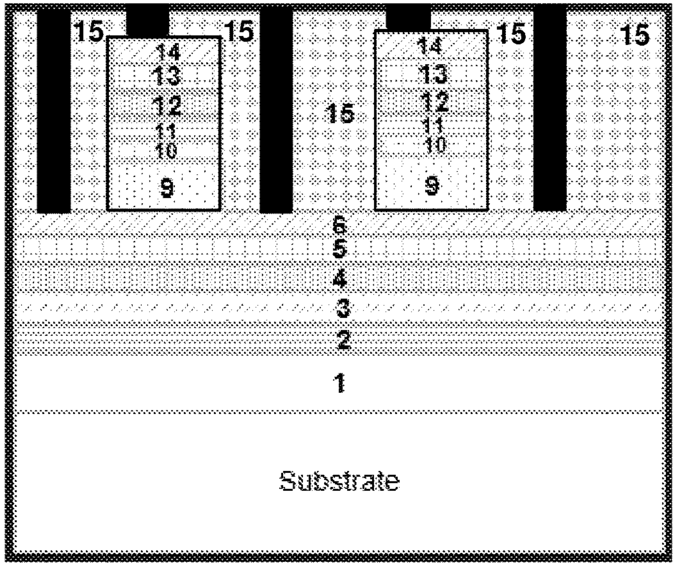
Figure 18:
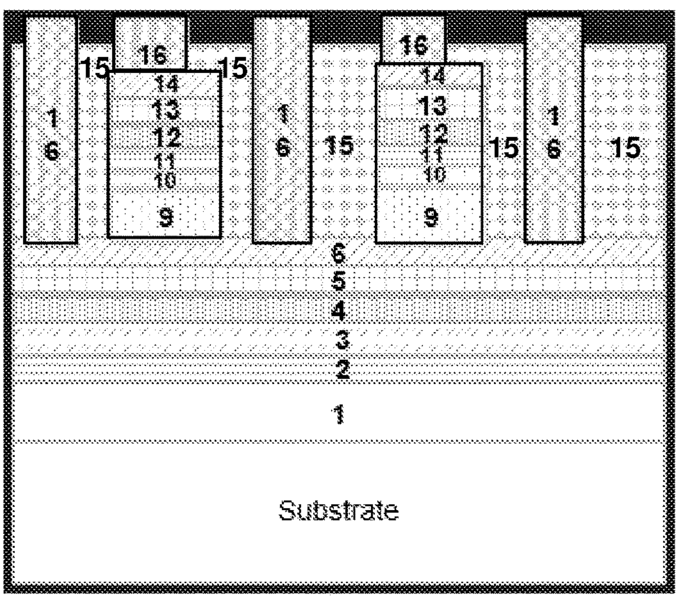
Figure 19:
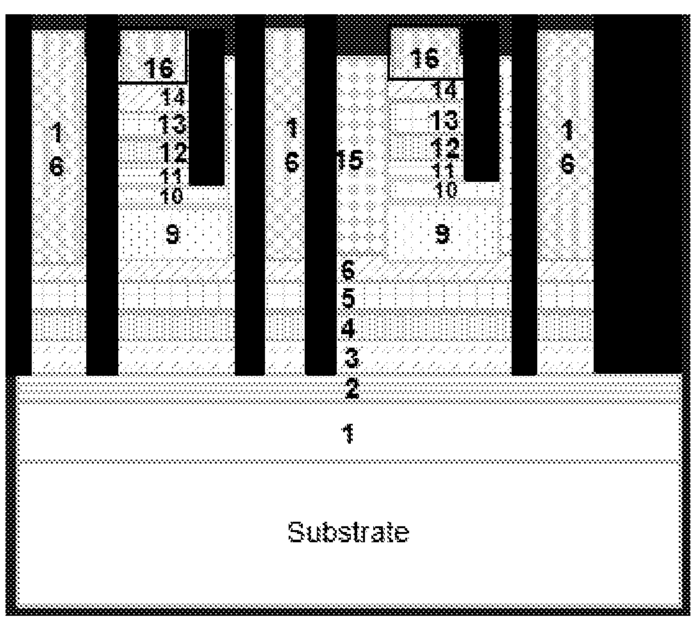
Figure 20:
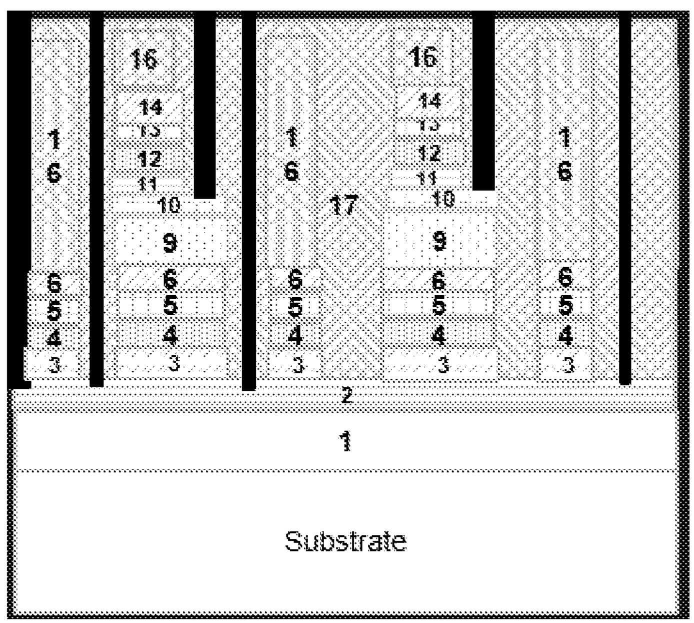
Figure 21:
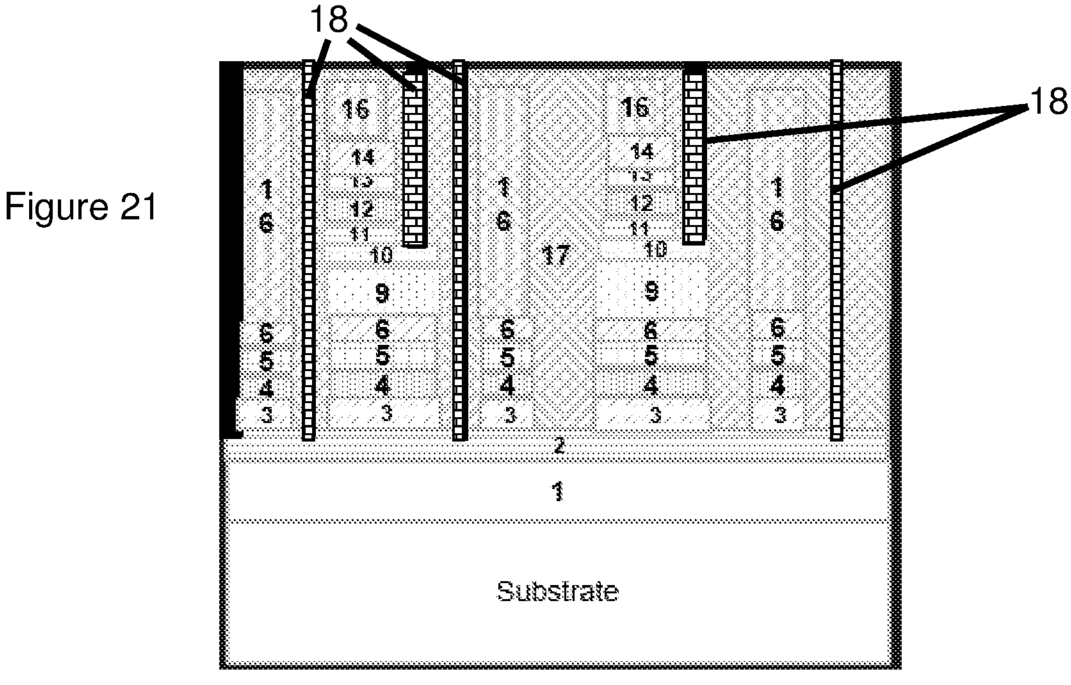
Figure 22:
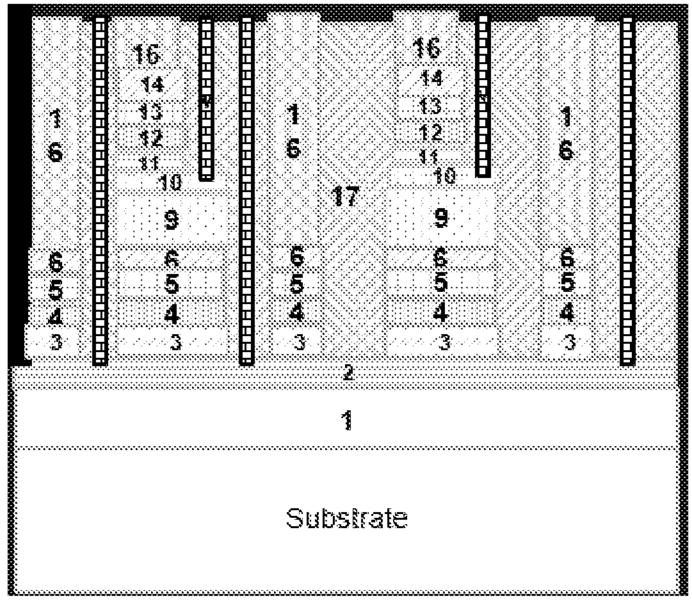

A second mask layer 15 is deposited on the wafer surface as shown in FIG. 16. Second mask layer 15 is the new passivation layer, which covers the surfaces and side-walls of both the first and second LED structures. The second mask layer 15 can be SiO2, SiN, SiON, Aluminium, Tantalum of hafnium containing oxide or combination of these layers. The layer is deposited via plasma enhanced chemical vapor deposition, via sputtering or any other suitable technique (e.g Atomic layer deposition). The thickness of the passivation layer may vary between 20-2000 nm.

FIG. 17—EXPOSING P-DOPED LAYERS

In the next step device processing is started. The first step is to create openings in the second mask layer 15 to access the first p-doped layer 6 and the second p-doped layer 14, so that electrical contact may be made to the p-doped portions of the first and second LED structures.

Standard photolithography techniques can be used to create the openings in the second mask layer 15. The size of the openings can vary between 200 nm-50000 nm. This distance between the openings can be between 500 nm-30000 nm. The openings are created only in specific regions so that the p-doped layers 6, 14 of both the diode structures are exposed.

Buffered oxide etch or other suitable wet chemistry can be used to create the openings.

FIG. 18—TRANSPARENT CONDUCTING LAYER

The exposed first and second p-type layers 6, 14 are then covered with a transparent conducting layer 16, such as a transparent conducting oxide (e.g ITO, ZnO on other compatible oxides) or with metal layers, to form electrical p-contacts. The covering can be done with a single step or multiple steps. The metals can be covering the pixels completely or partially. The metal may contain Ti, Pt, Pd, Rh, Ni, Au, Ag etc. The thickness of the complete metal stack can be between 200-2000 nm.

Transparent conducting layers are well known in the art, and any suitable material and thickness may be used.

FIG. 19—OPENINGS FOR N-CONTACTS

Standard photolithography techniques start the process of accessing the n-type layers 2, 10 of the first and second LED structures. As the first n-type layer 2 is covered by multiple overgrown semiconductor layers, in order to form an electrical n-connection with the first n-type layer 2, access paths may be etched through the second mask layer 15 and through all overlying layers of the first LED structure.

This is followed by a dry etch process that can be done via inductively couple plasma reaction ion process, only reactive ion etch process or a neutral beam etch process.

FIG. 20—THIRD MASK LAYER

After the access paths for n-doped layers 2, 10 are created, a new third mask layer 17 is deposited on the wafer surface. Third mask layer 17 is a new passivation layer, which covers the side walls of the first and second LED structures. The third mask layer 17 can be formed from SiO2, SiN, SiON, Aluminium, Tantalum of hafnium containing oxide or combination of these layers. The layer 17 is deposited via plasma enhanced chemical vapor deposition, via sputtering or any other suitable technique (e.g Atomic layer deposition). The thickness of the third mask layer 17 may vary between 20-2000 nm.

Openings in the third mask layer 17 to re-expose the n-type layers 2, 10 of the first and second LED structures can be created via wet or dry etching processes. In this particular example a dry etching process is used.

FIG. 21—ELECTRICAL N-CONTACTS

The next step in device fabrication is to cover the openings in the third mask layer 17 with metal layers to access the n-doped layers 2, 10 of the LED structures. The covering can be done with a single step or multiple steps. The metals can be covering the pixels completely or partially. In this example a single step is used to simplify the details.

The metal may contain Ti, Pt, Pd, Rh, Ni, Au. The thickness of the complete metal stack can be between 200-2000 nm.

FIG. 22—EXPOSING P-CONTACTS

The final step is another wet or dry etching step of the third mask layer 17 to re-expose the p-doped contacts 16.

The openings in the third mask layer 17 can be created via wet or dry etching processes. In this particular example a dry etching process is used.

The illustrated micro-LED array in FIGS. 2-22 is designed to have two sets of LEDs that emit light at two different emission wavelengths: between 515-550 nm and between 600 nm-665 nm when an electrical bias is applied. The illustrated device is configured to emit light from the p-side of the device (the top of the micro-LED array as shown). The emission wavelengths of both the first and second light-emitting regions may be tuned as desired to obtain LEDs of whatever colour combination is desired. A third array of third LED structures may also be added to the wafer to provide arrays of LEDs emitting at three discrete wavelengths.

FIGS. 23-30—THREE COLOUR LED

FIGS. 23 to 30 are schematic side-on cross-sections illustrating the steps of manufacturing a three colour LED device according to a preferred embodiment of the present invention.

Figures 6, 7, 8, 9:
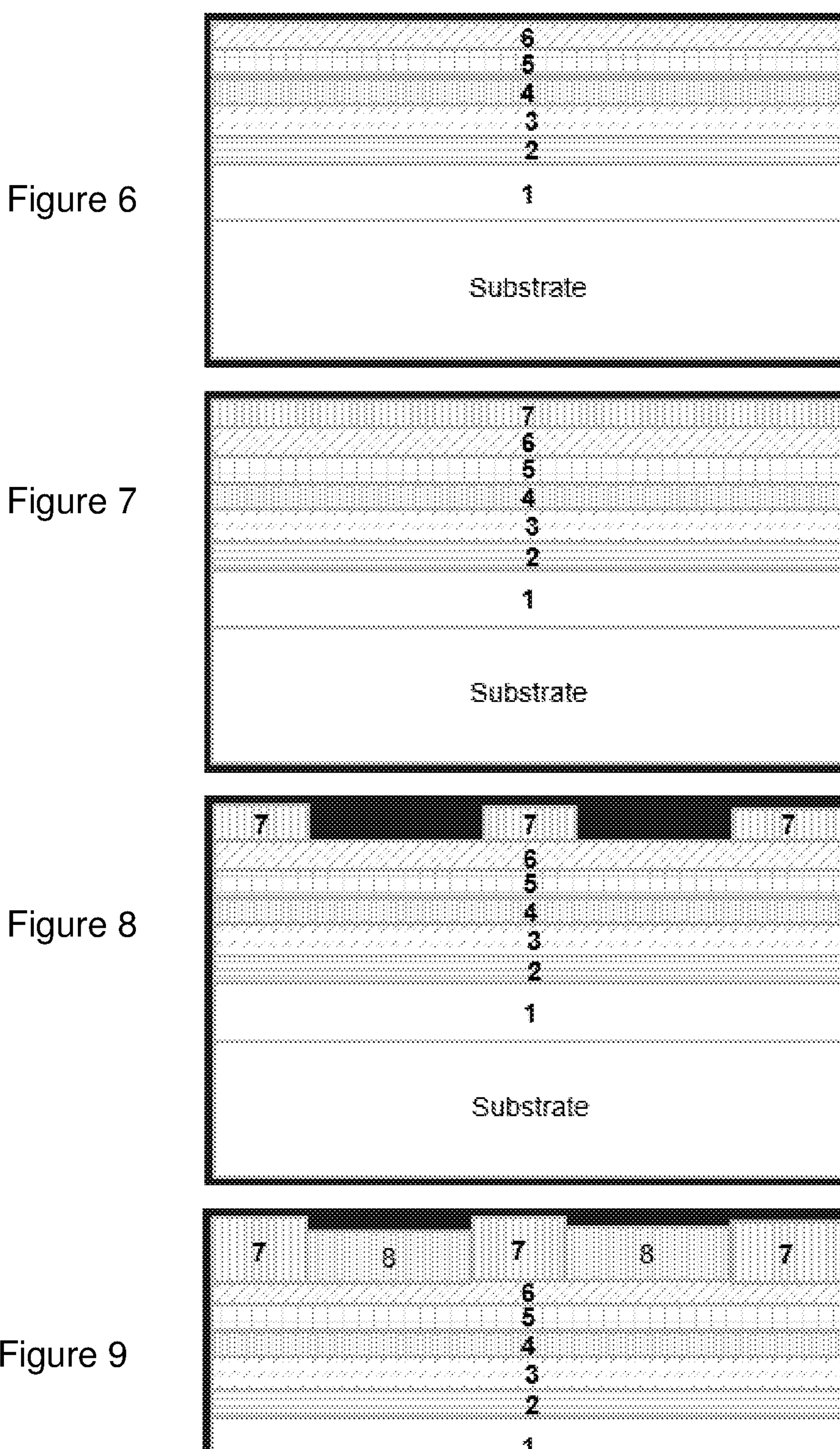
Figure 10:
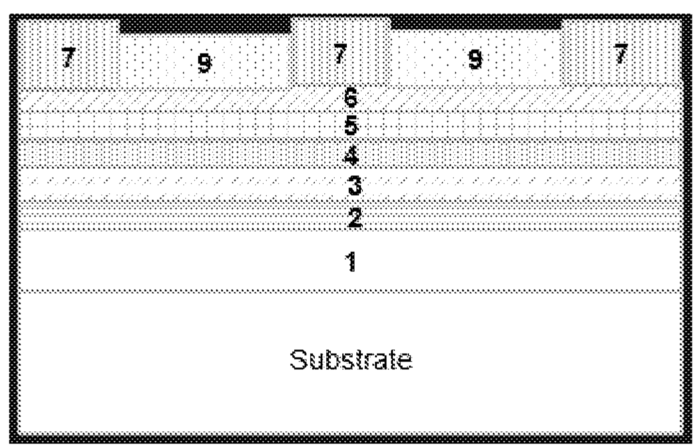
Figure 11:
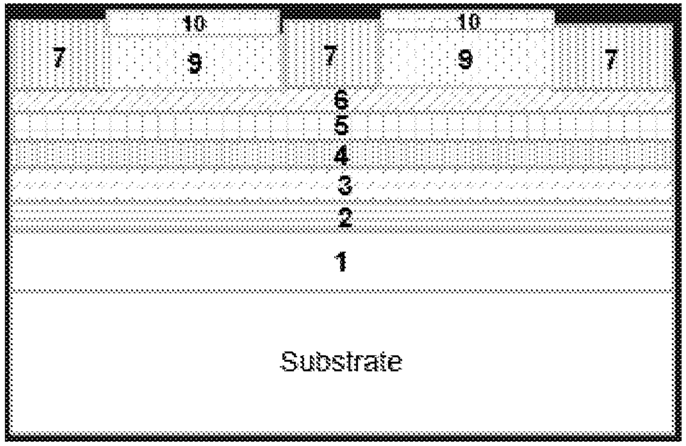
Figure 12:
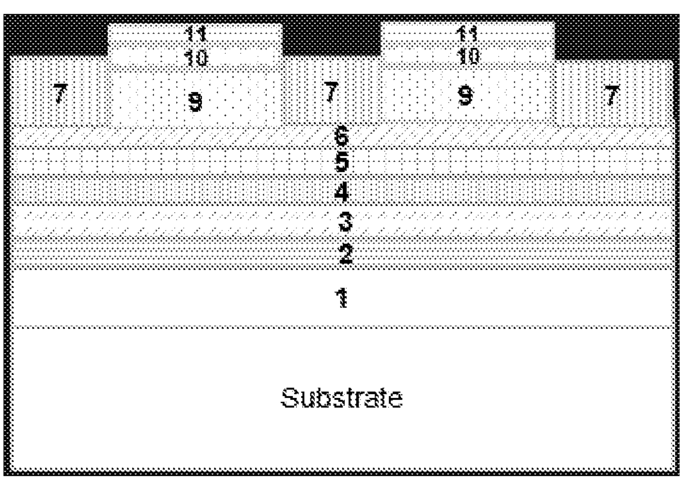
Figure 13:
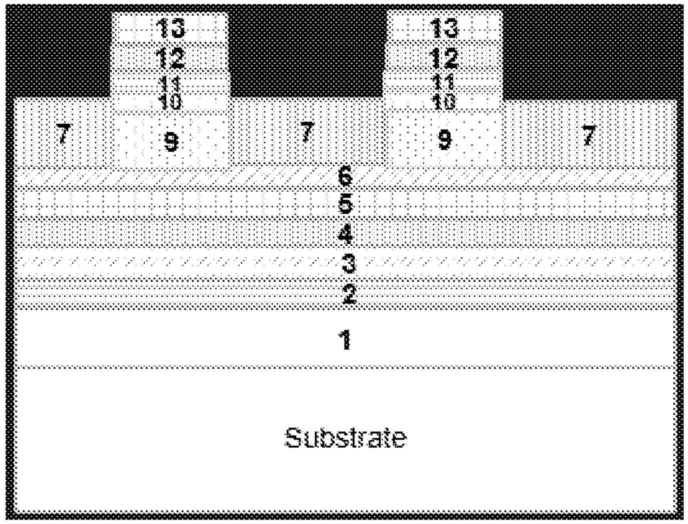
Figure 14:
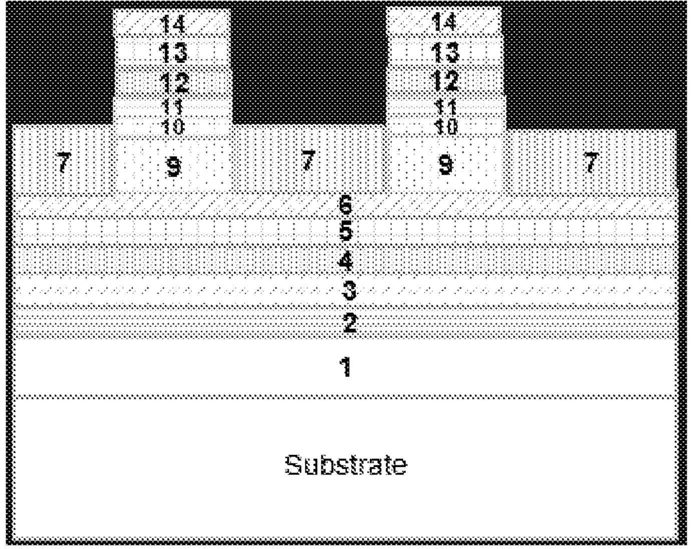
Figure 15:
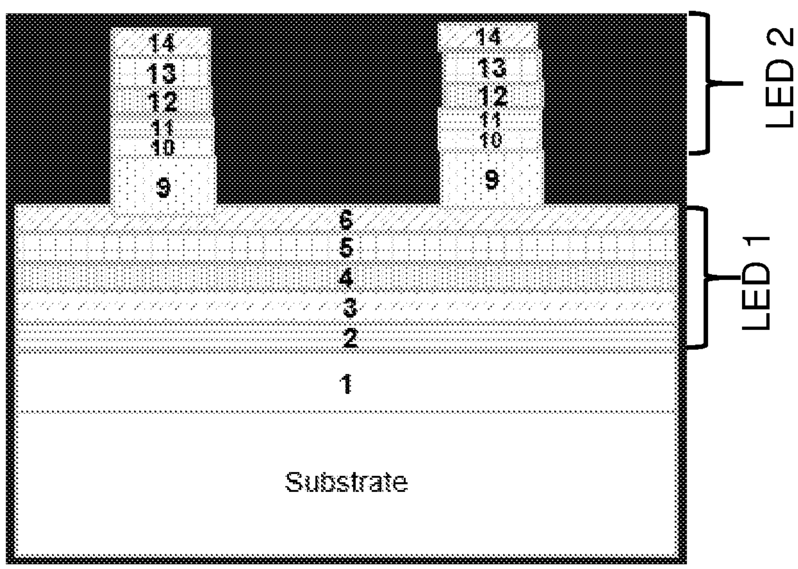
Figures 23, 24, 25:
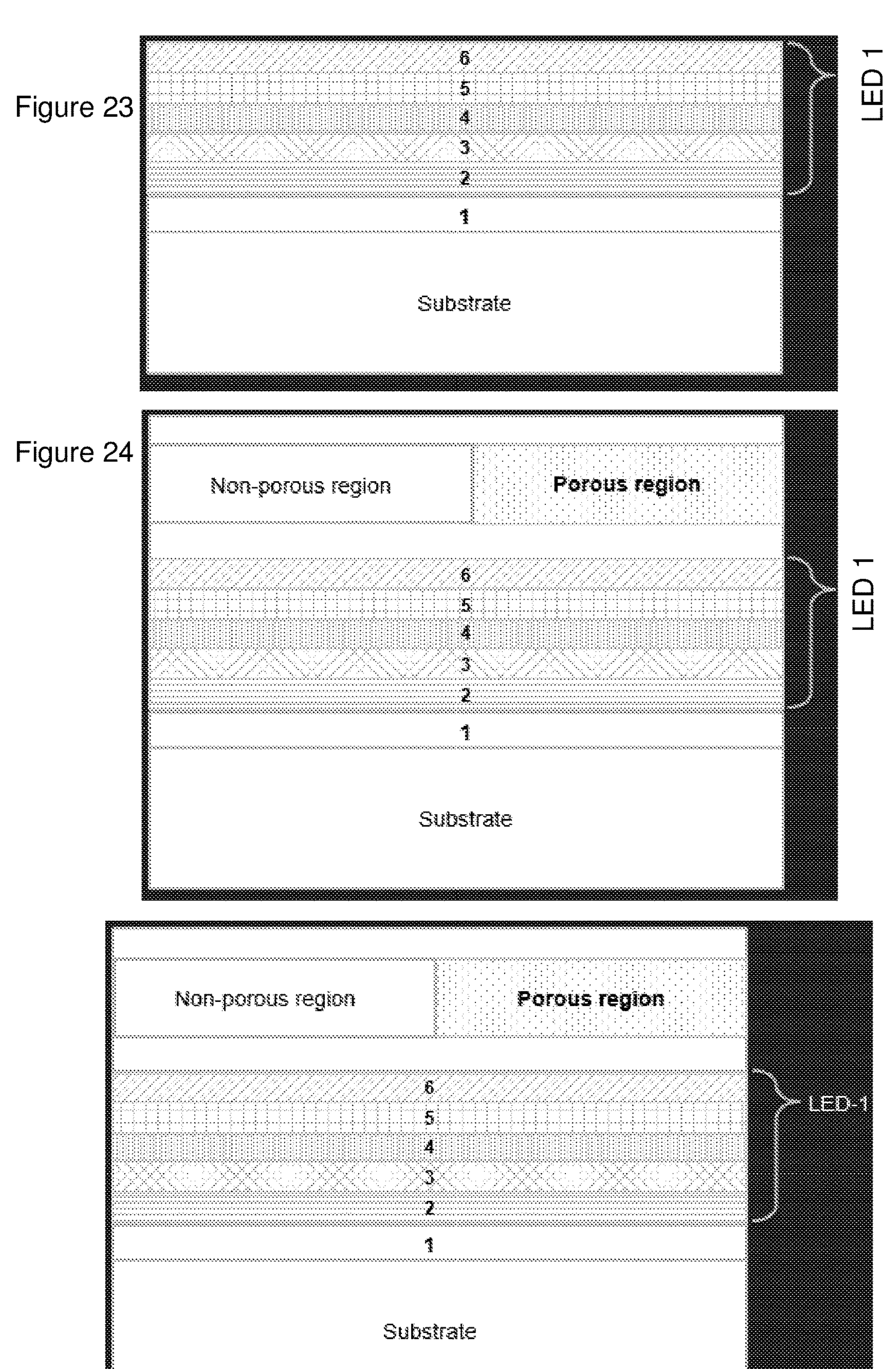
FIGS. 23 to 30 are schematic side-on cross-sections illustrating the steps of manufacturing a three colour LED device according to a preferred embodiment of the present invention.
Figure 26:
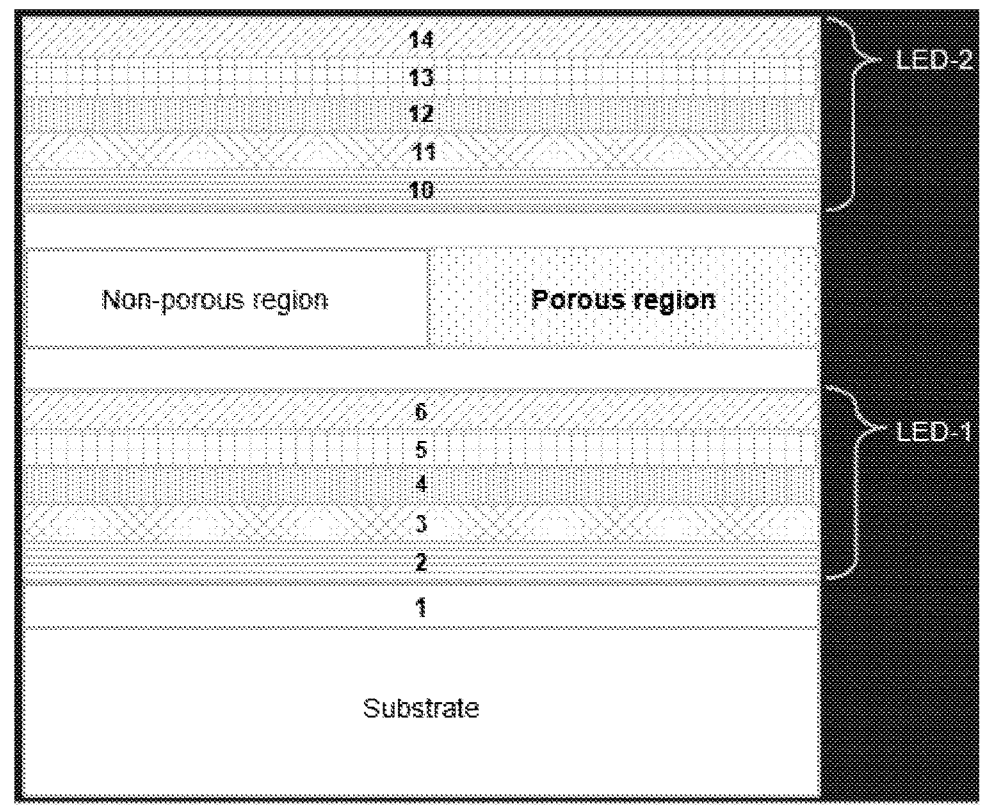

FIG. 23 illustrates a first LED structure as shown in FIG. 6, in which a first LED structure made up of layers 2-6 is formed over a buffer layer 1 of III-nitride material on a substrate.

Other than the emission wavelengths of the light-emitting regions, the details of the numbered regions (or layers) of the device shown in FIGS. 23-30 are consistent with those described above in relation to FIGS. 1-22.

A first LED structure made up of layers 2 to 6 (described above in relation to FIGS. 1 to 22) are grown over a substrate. The first LED is preferably a blue LED with emission wavelength under electrical bias between 400-500 nm, preferably 430-470 nm.

Over the top of the first p-doped layer 6 are deposited several layers of III-nitride material, including an n-doped region and a non-doped region of III-nitride material which occupy adjacent lateral portions of a single layer. The n-doped region is then electrochemically porosified, as described above, to form a porous region of III-nitride material which is positioned over a portion of the first p-doped layer 6. In the illustrated embodiment, around half of the lateral width of the structure is covered by the porous region, while the other half is covered by a non-porous region of III-nitride material, which is undoped and is therefore not porosified during the etching step. Porosification takes place through a non-porous intermediate layer of III-nitride material, as described above.

The non-porous intermediate layer of III-nitride material spans the entire width of the structure, and covers both the porous region and the non-porous region.

Over the top of the non-porous intermediate layer, a second LED structure is grown. The second LED structure is made up of layers 10-14, as described above in relation to FIGS. 1 to 22. The second LED structure is preferably a conventional green LED structure configured to emit light at a peak emission wavelength under electrical bias of between 500-600 nm, preferably 520-540 nm.

The second LED structure is overgrown across the entire width of the structure, so that a portion of the second LED structure is positioned directly above the porous region, while another portion of the second LED structure is positioned directly above the non-porous region.

Figure 27:
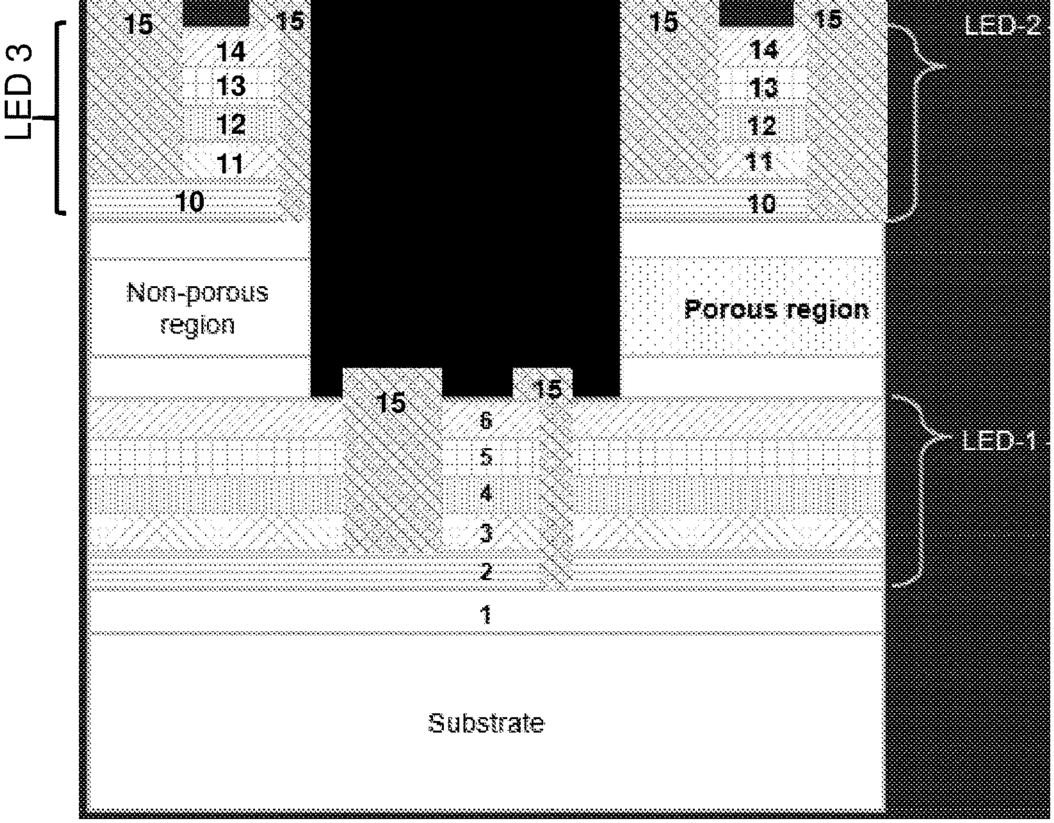
Figure 28:
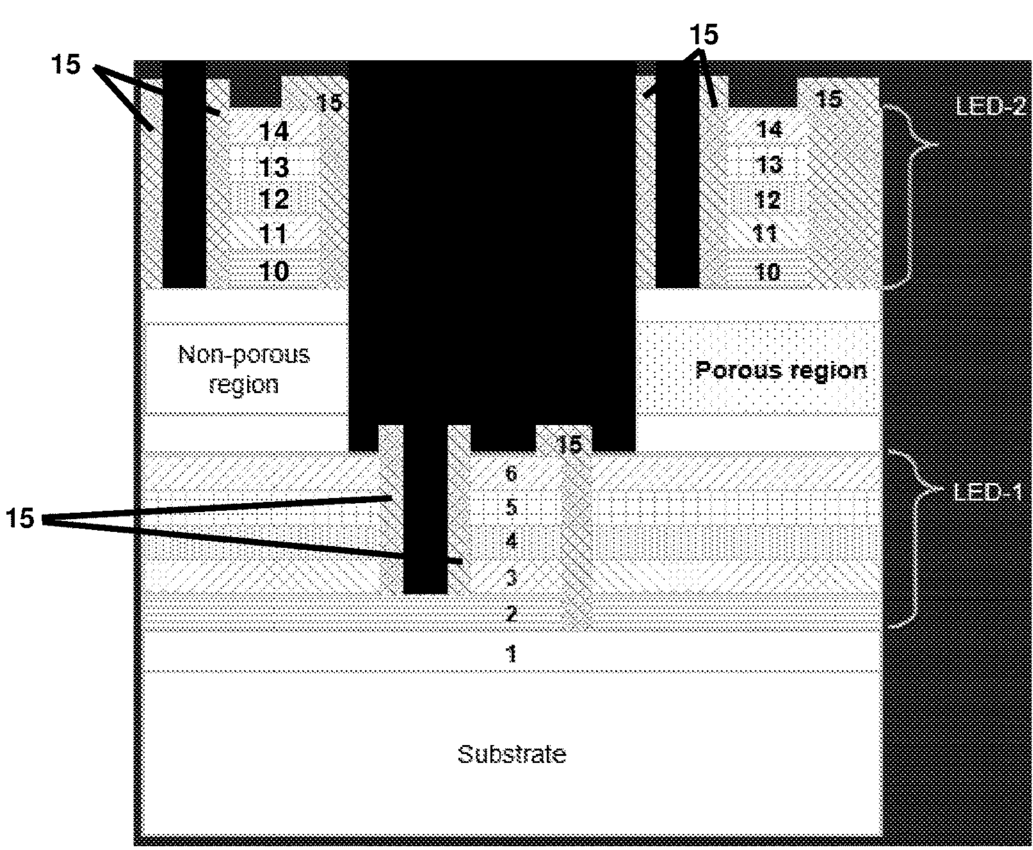
Figure 29:
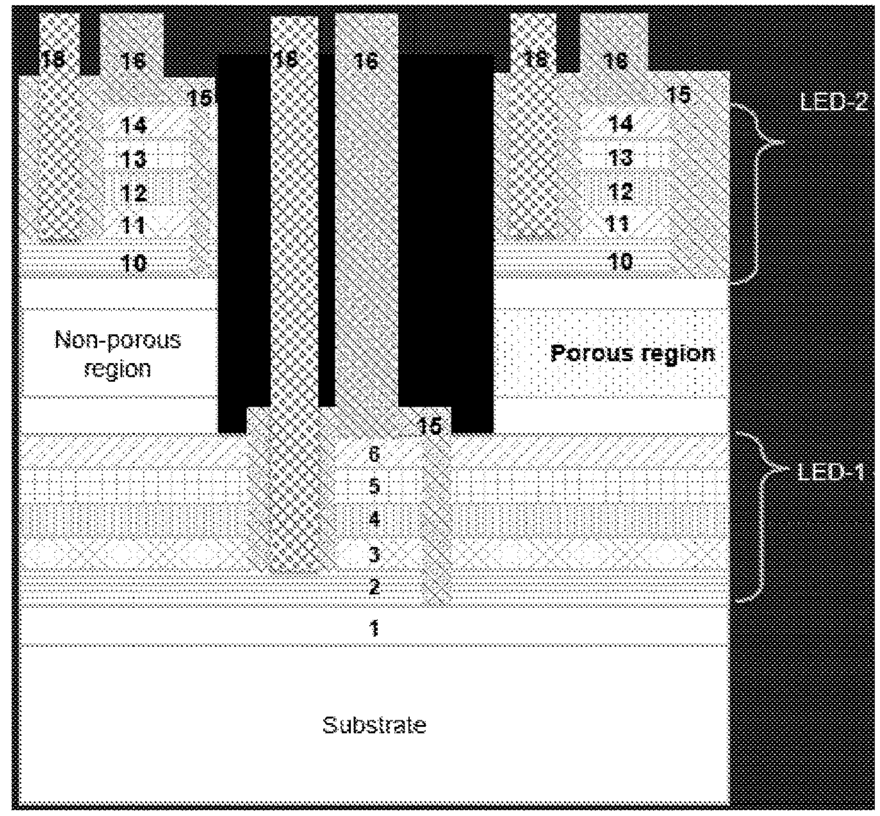

Standard semiconductor processing steps are then used to divide the second LED structure (10-14) into two separate mesas, as shown in FIG. 27, and to expose a region of the first LED structure. This division of the second LED structure creates one "pillar" or "mesa" of the second LED structure that is positioned above the porous region, and another one "pillar" or "mesa" of the second LED structure that is positioned above the non-porous region. The pillar of LED structure that is positioned above the non-porous region may be referred to as a third LED structure, LED3, while the pillar above the porous region is still referred to as the second LED structure, LED 2.

The device processing steps of passivating the LED structures with mask layer 15, exposing conductive regions of the LED structures and depositing p-contacts 16 and n-contacts 18 are carried out as described above.

Figure 30:
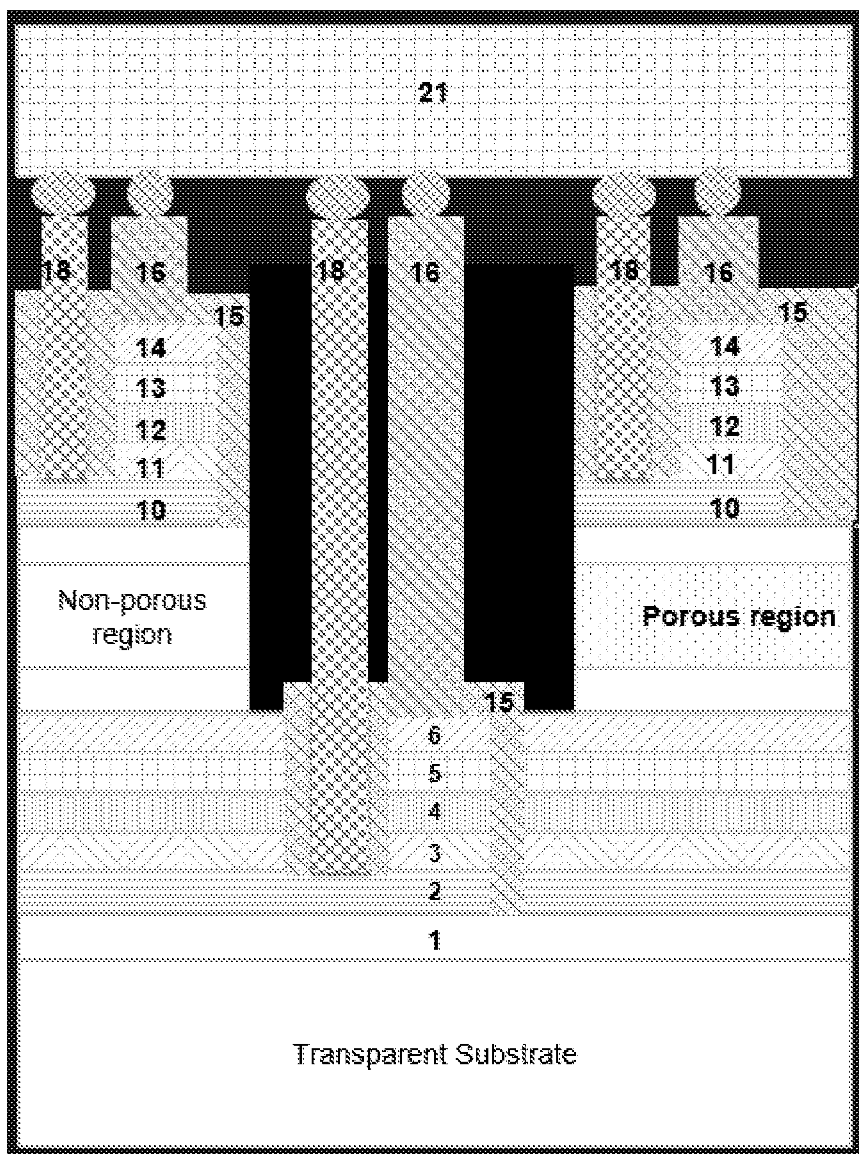

As shown in FIG. 30, the substrate can be removed or retained. In one case, the substrate is removed and transferred or attached to another substrate. The top electrodes are then bonded to another carrier wafer/substrate 21 or microdriver circuit board or backplane, to form an array of pixels.

In a preferred embodiment, the second LED structure is preferably a conventional green LED structure configured to emit light at a peak emission wavelength under electrical bias of between 500-600 nm, preferably 520-540 nm. As described above, however, the fact that the second LED structure is positioned over a porous region of III-nitride material creates a red-shift in the emission wavelength of the second LED structure relative to the identical third LED structure that is not formed over a porous region. The result of this is that the light-emitting region in the third LED structure emits at a peak EL wavelength of around 515 nm-540 nm, while the wavelength-shifted second LED structure emits at a peak EL wavelength of around 580 nm-650 nm.

The LED device is therefore a red-green-blue LED device which contains a first LED structure that emits blue light, a second LED structure that emits red light, and a third LED structure that emits green light.

By providing all three of these LED structures in an integrated device, manufactured on the same substrate, a red-green-blue LED device is advantageously provided, in which red, green and blue LED structures form coloured pixels for light emission, particularly in which the red, green and blue pixels are formed in closer proximity than has been possible using prior art manufacturing methods.

The skilled person will understand that the emission wavelengths of the individual LED structures may be controlled by altering the composition and layer structures of the LED structures according to known principles of LED construction. Thus a variety of multi-coloured LED devices may be provided using the present invention, and colour combinations other than red, green and blue may of course be provided.

FIGS. 31-37

Figure 31:
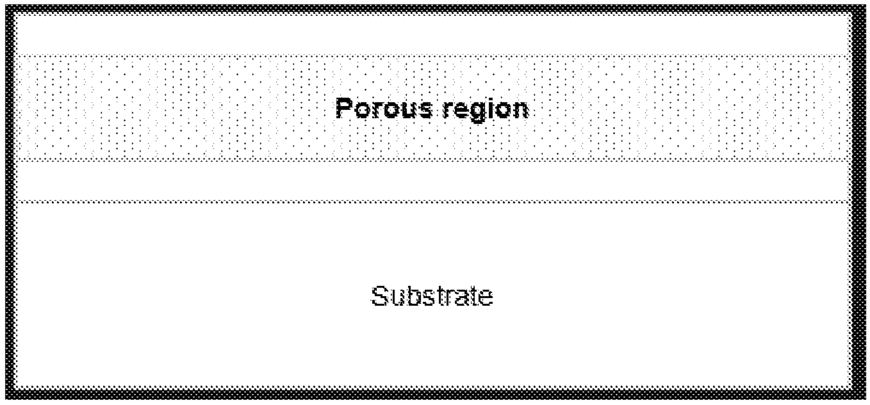
FIGS. 31-37 are schematic side-on cross-sections illustrating the steps of an alternative method of manufacturing a three colour LED device according to a preferred embodiment of the present invention.

FIG. 31 illustrates a porous template suitable for an LED device according to the present invention.

The porous template comprises a porous region of III-nitride material on a substrate, with a non-porous layer of III-nitride material arranged over the top surface of the porous region. Optionally there may be further layers of III-nitride material between the substrate and the porous region.

As described in more detail above, the porous region may be provided by epitaxially growing an n-doped region of III-nitride material and then an undoped layer of III-nitride material, and porosifying the n-doped region using the porosification process as set out in international patent applications PCT/GB2017/052895 (published as WO2019/063957) and PCT/GB2019/050213 (published as WO2019/145728).

The porous region may comprise one or more layers one or more III-nitride materials, and may have a range of thicknesses. In preferred embodiments, the porous region may for example comprise GaN and/or InGaN and or AlGaN.

Figure 32:
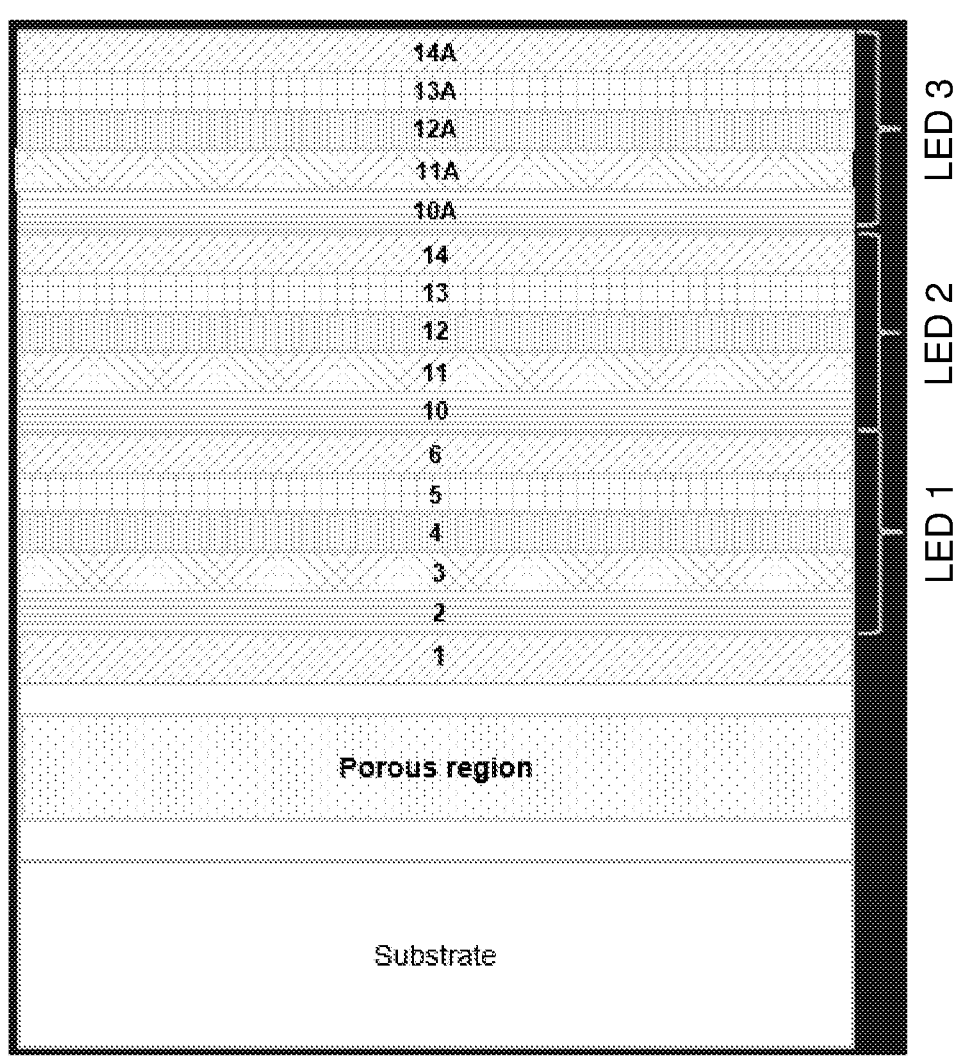
Figure 33:
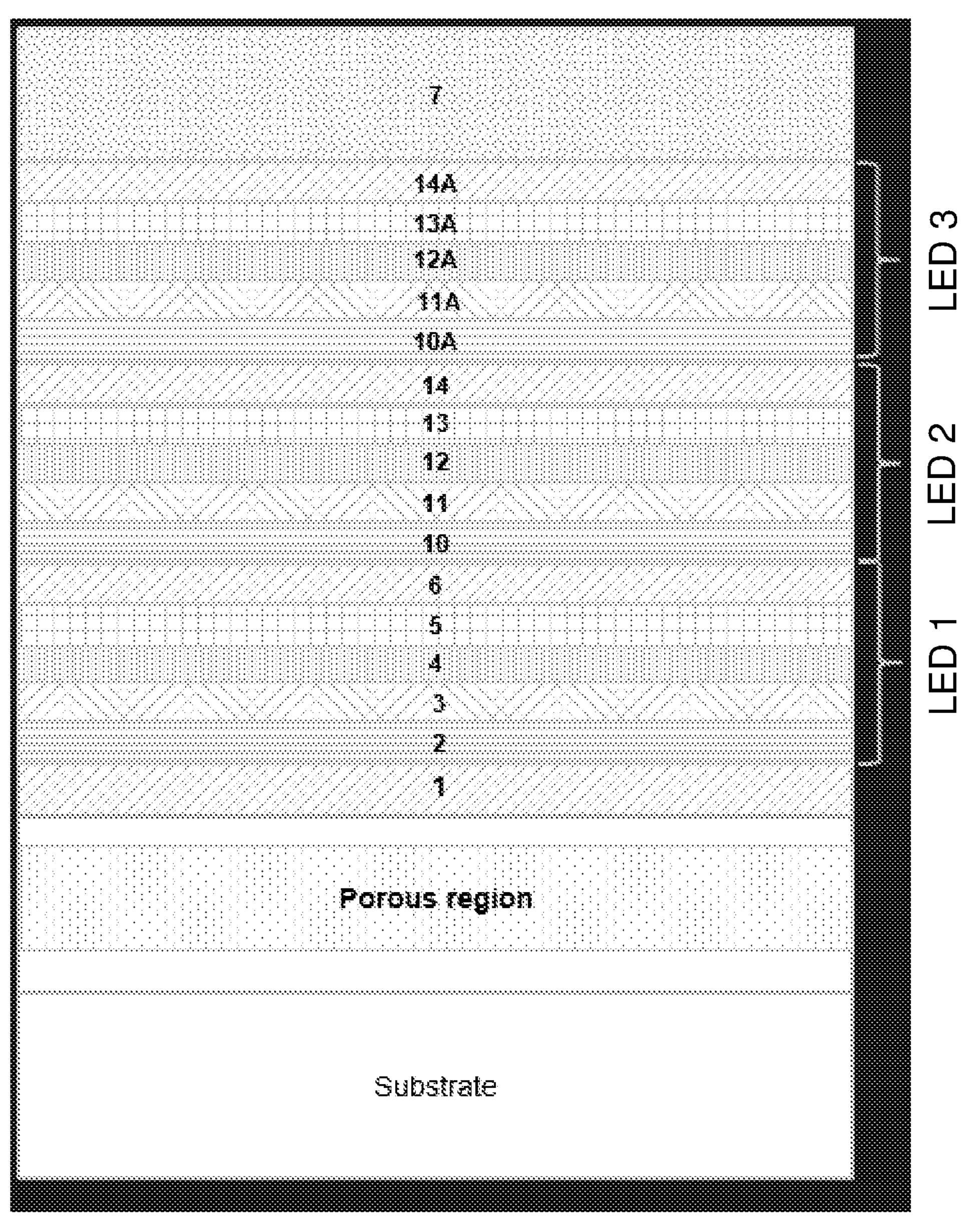
Figure 34:
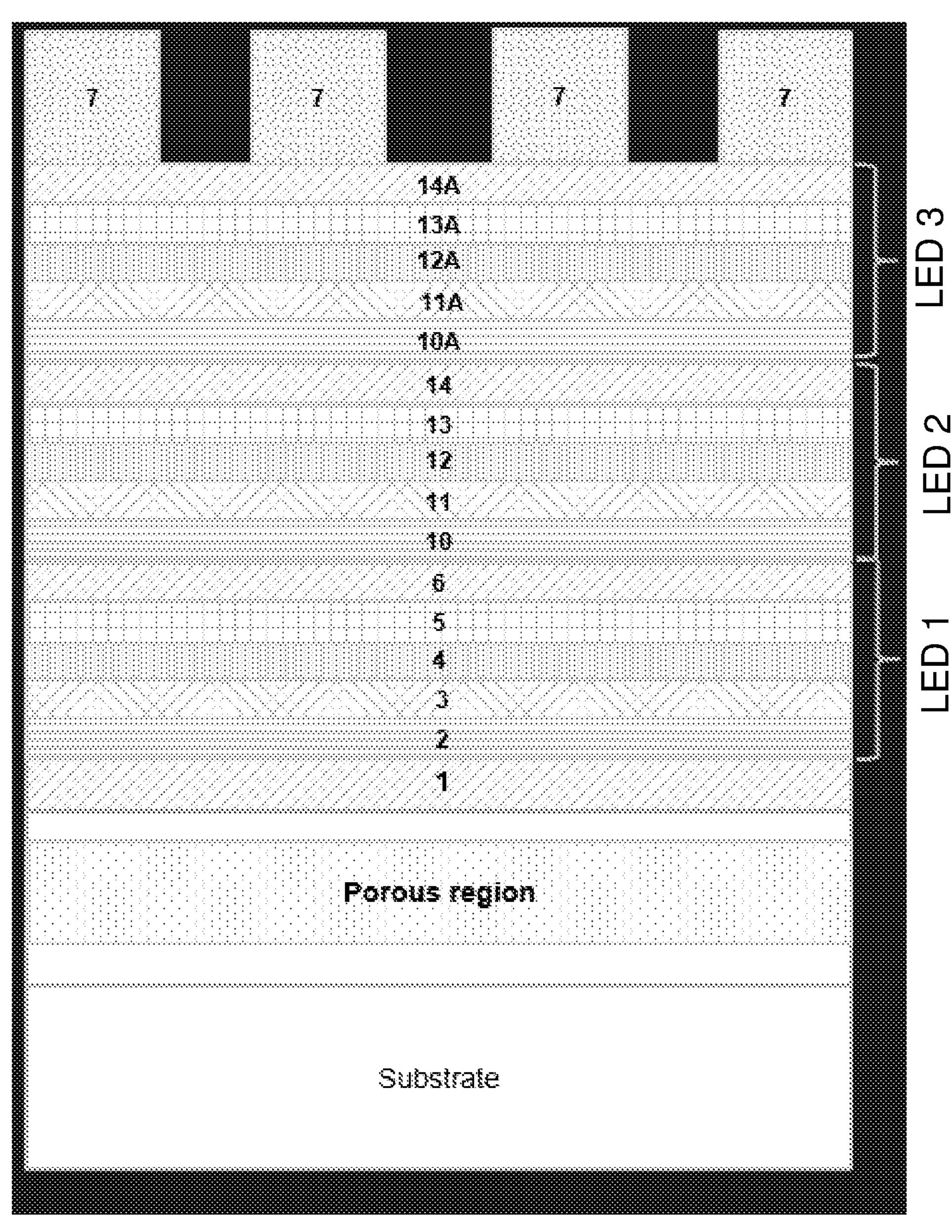

As shown in FIG. 32, three LED structures may be grown one on top of another upon the porous template of FIG. 31.

Other than the emission wavelengths of the light-emitting regions, the details of the numbered regions (or layers) of the device shown in FIGS. 23-30 are consistent with those described above in relation to FIGS. 1-22.

The manufacturing steps illustrated in FIGS. 22-30 are similar to those described above in relation to FIGS. 1-22.

A first LED structure (LED 1) made up of layers 2 to 6 (described above in relation to FIGS. 1 to 22) are grown over a substrate. The first LED is preferably a blue LED with emission wavelength under electrical bias between 400-500 nm, preferably 430-470 nm.

A second LED structure (LED 2) made up of layers 10 to 14 (described above in relation to FIGS. 1 to 22) are grown over the top of the first LED structure. The second LED structure is preferably a green LED with emission wavelength under electrical bias between 500-600 nm, preferably 520-540 nm.

A third LED structure (LED 3) made up of layers 10A to 14A (equivalent to regions 10-14 described above in relation to FIGS. 1 to 22) are grown over the top of the second LED structure. The second LED structure is preferably a red LED with a peak emission wavelength under electrical bias of between 600-750 nm, preferably 600-650 nm.

The regions in the illustrated embodiments are:

18—n-contacts

17—passivation layer after exposing n-doped layers

16—p-contacts

15—mask layer

14A—p-doped layer (LED3)

13A—EBL (LED3)

12A—cap layer (LED3)

11A—light-emitting region (LED3)
10A—n-doped layer (LED3)
14—p-doped layer (LED2)
13—EBL (LED2)
12—cap layer (LED2)
11—light-emitting region (LED2)
10—n-doped layer (LED2)
7—mask layer
6—p-doped layer (LED1)
5—EBL (LED1)
4—cap layer (LED1)
3—light-emitting region (LED1)
2—n-doped layer (LED1)
1—Template layer (undoped or n-doped III-nitride material)
Substrate A mask 7 is applied to the top surface of the third p-doped layer 14A of the third LED structure. Openings are then formed in the mask layer 7, and conventional semiconductor etching techniques are used to remove portions of the layers 10A-14A and layers 10-14.

Figure 35:
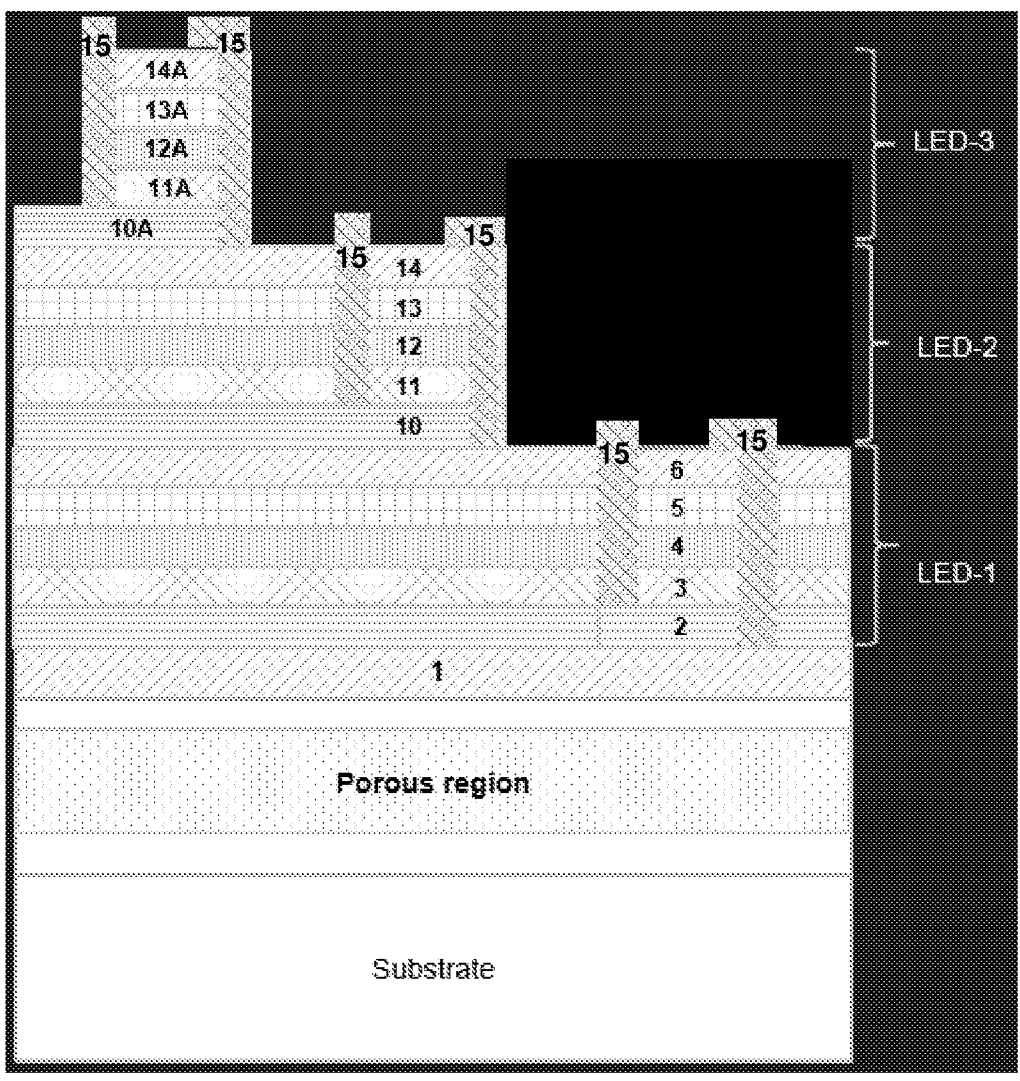
Figure 36:
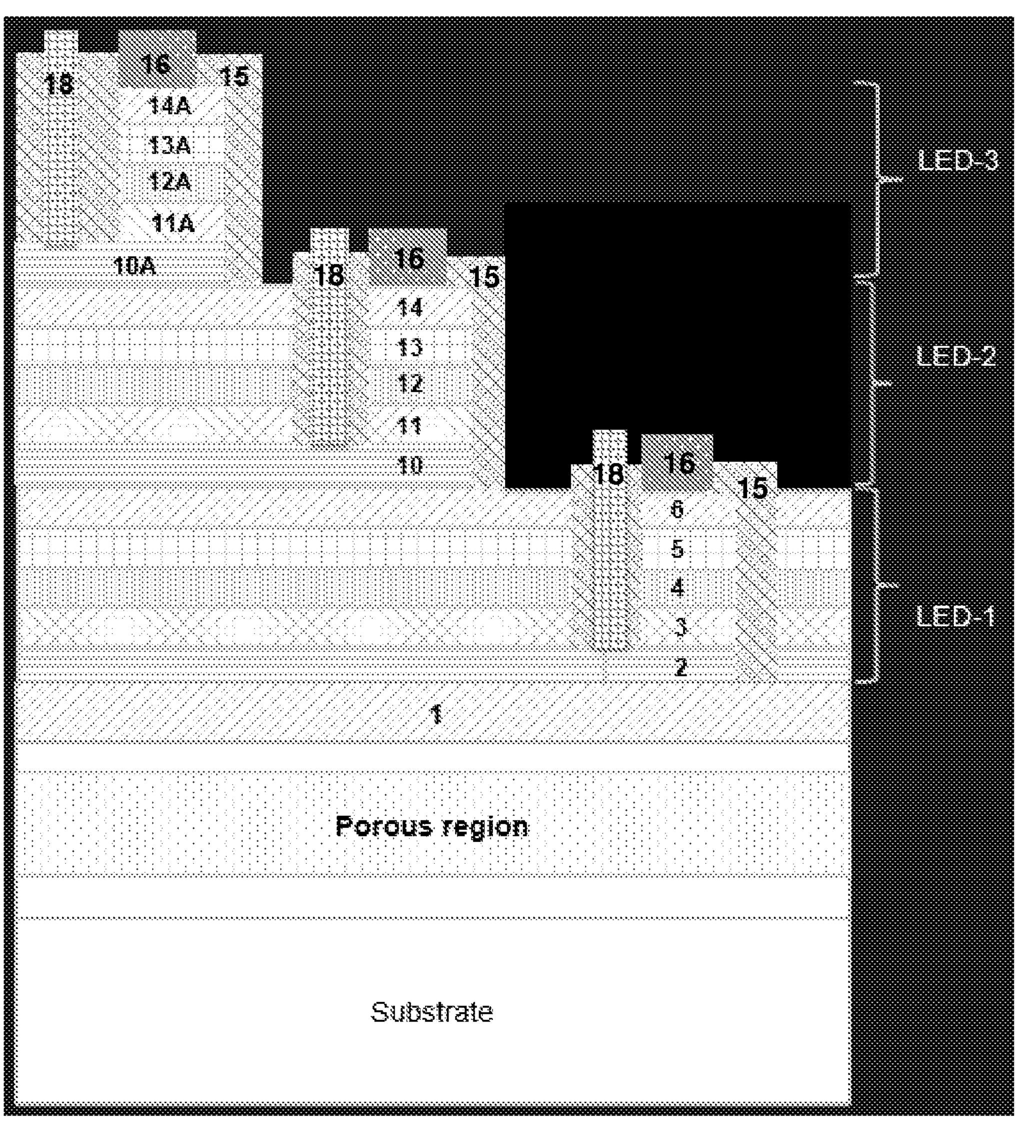

Following etching, the p-doped layers 6, 14, and 14A of the first, second and third LED structures are exposed, as shown in FIG. 35. There remains a pillar or mesa of the third LED structure formed by layers 10A-14A, a portion of the second LED structure formed by layers 10-14 with no overlying semiconductor layers, and a portion of the first LED structure formed by layers 2-6 with no overlying semiconductor layers.

The device processing steps of passivating the LED structures with mask layer 15, exposing conductive regions of the LED structures and depositing p-contacts 16 and n-contacts 18 are carried out as described above.

Figure 37:
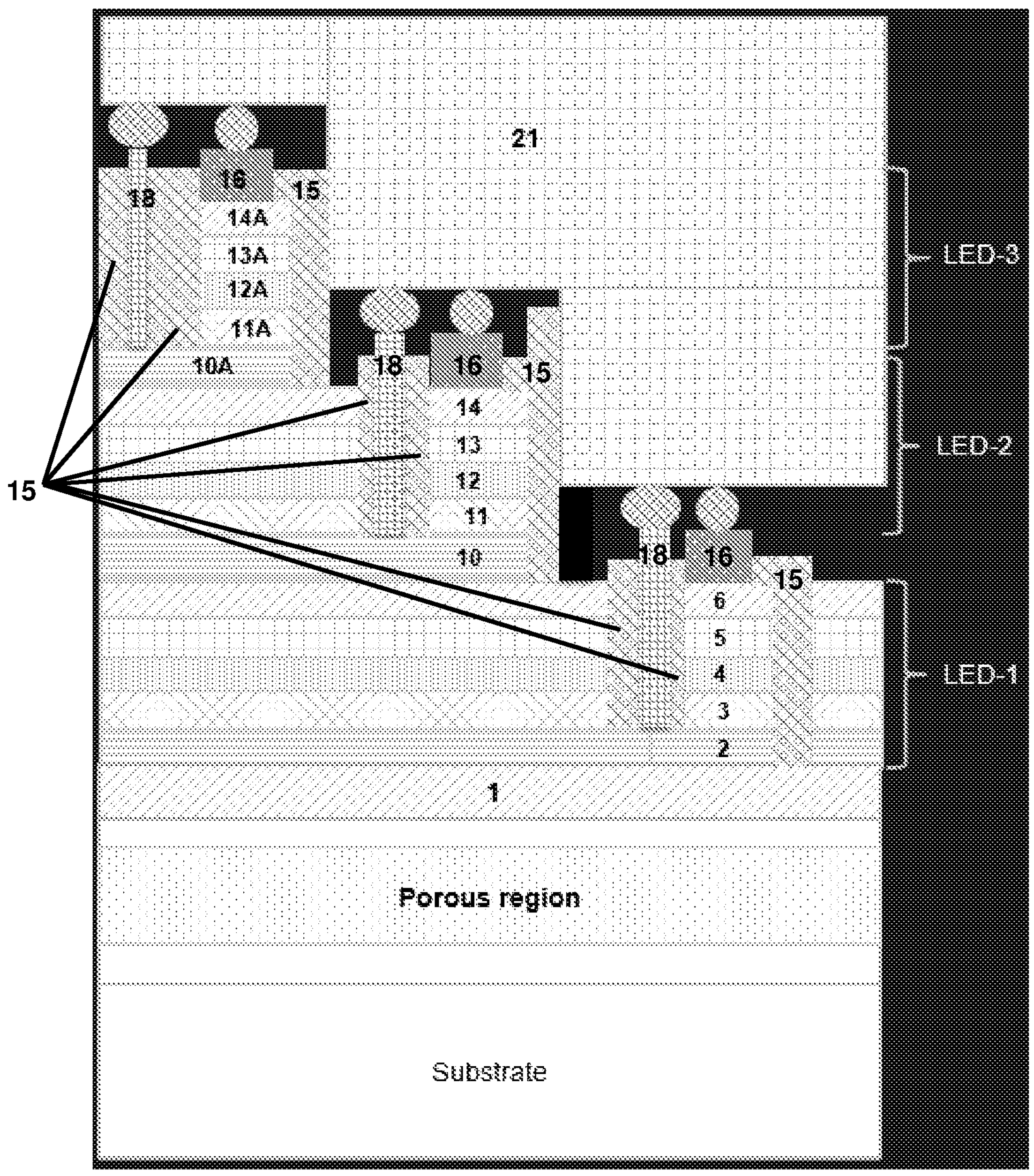

As shown in FIG. 37, the substrate can be removed or retained as part of the LED device. In one case, the substrate is removed and transferred or attached to another substrate. The top electrodes are then bonded to another carrier wafer/substrate 21, or to a microdriver circuit board or backplane to form an array of pixels.

Similarly to the embodiment described in FIGS. 23-30, the LED device is therefore a red-green-blue LED device which contains a first LED structure that emits blue light, a second LED structure that emits red light, and a third LED structure that emits green light. In this embodiment, as all three LED structures are formed over the porous region, all three will benefit from the strain relaxation effect described above.

Red Shift

Figure 38:
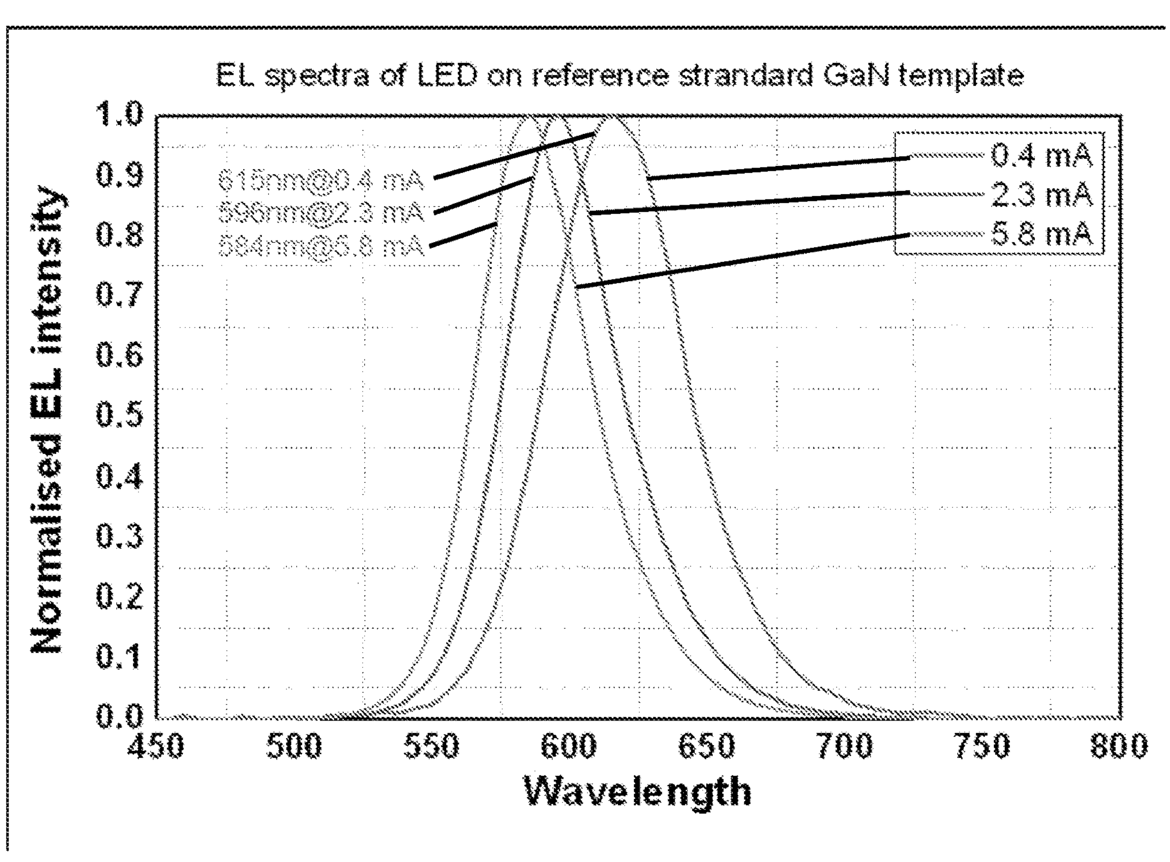
FIG. 38 is a graph of normalised electroluminescence (EL) intensity vs wavelength at different current injections, for an InGaN LED on a non-porous substrate.
Figure 39:
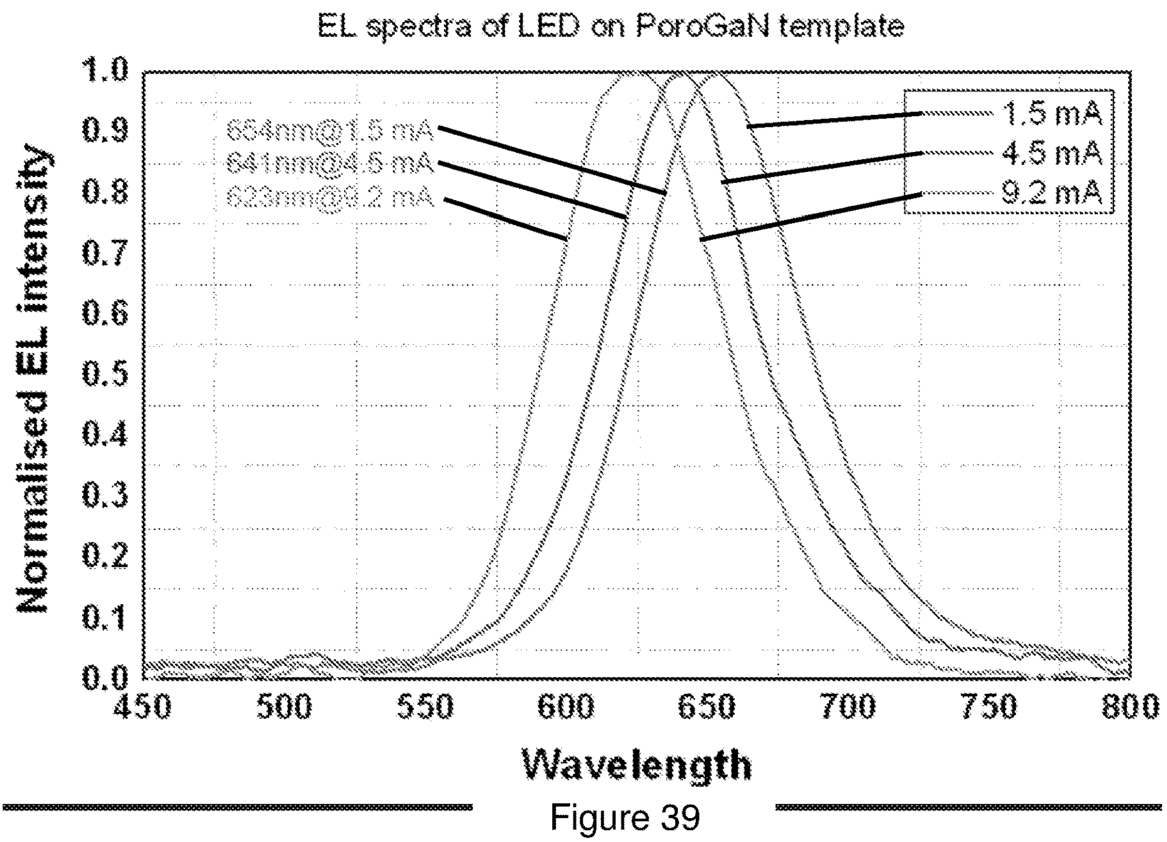
FIG. 39 is a graph of normalised electroluminescence (EL) intensity vs wavelength at different current injections, for the same InGaN LED as FIG. 38 grown over a porous region according to a preferred embodiment of the present invention.

FIGS. 38 and 39 compare the emission characteristics of an InGaN LED on a non-porous substrate (FIG. 38) and the same InGaN LED grown on a template comprising a porous layer of III-nitride material (FIG. 39). Comparison of these two graphs demonstrates the shift towards longer emission wavelengths caused by the porous underlayer, as the emission of the LED on the porous template is consistently between 21 nm and 45 nm longer than that of the same LED on the non-porous template. Thus when the first LED structure is grown over the porous region and the identical second LED structure is grown over the non-porous region, the first LED structure light emits at a longer wavelength than the second LED structure.

The invention claimed is:

1. A light-emitting diode (LED) device, comprising:
a first LED structure;
a porous region of III-nitride material over the first LED structure, and
a second LED structure positioned over the porous region of III-nitride material,
additionally comprising a non-porous region of III-nitride material positioned over a p-doped portion of the first LED structure, the non-porous region being positioned in a same plane as the porous region of III-nitride material.

2. An LED device according to claim 1, additionally comprising a third LED structure, in which the third LED structure is positioned over the first LED structure or over the second LED structure.

3. An LED device according to claim 2, in which the third LED structure is positioned over the non-porous region of III-nitride material.

4. A three colour red-green-blue (RGB) light-emitting diode (LED) device, comprising:
a first LED structure, configured to emit light at a first emission wavelength,
a second LED structure, configured to emit light at a second emission wavelength different from the first emission wavelength, positioned over the first LED structure, and
a third LED structure, configured to emit light at a third emission wavelength different from the first and second emission wavelengths, positioned over the first LED structure,
in which at least one of the first and second LED structures is positioned over a first porous region of III-nitride material, and in which the third LED structure is not positioned over the first porous region of III-nitride material,
in which the third LED structures are configured to emit red, green and blue light under an applied electrical bias, in which the third LED structures are configured so that:
the first LED structure emits light at a peak wavelength between 400 and 500 nm;
the second LED structure emits light at a peak wavelength between 600 and 650 nm; and
the third LED structure emits light at a peak wavelength between 515 and 550 nm.

5. A three colour LED device according to claim 4, in which the second LED structure is positioned over the first porous region of III-nitride material.

6. A three colour LED device according to claim 5, in which the third LED structure is identical to the second LED structure, and in which the second and third LED structures emit light at different emission wavelengths due to the first porous region beneath the second LED structure.

7. A three colour LED device according to claim 5, in which the third LED structure is positioned over a non-porous region of III-nitride material above the first LED structure.

* * * * *